United States Patent
Yamamoto

Patent Number: 5,235,233
Date of Patent: Aug. 10, 1993

[54] SURFACE ACOUSTIC WAVE DEVICE

[75] Inventor: Shin-ichi Yamamoto, Kawasaki, Japan

[73] Assignee: Fanuc Ltd., Japan

[21] Appl. No.: 900,771

[22] Filed: Jun. 22, 1992

Related U.S. Application Data

[63] Continuation of Ser. No. 444,158, filed as PCT JP/89/00283, Mar. 16, 1989, published as WO/89/08949, Sep. 21, 1989, abandoned.

[30] Foreign Application Priority Data

Mar. 17, 1988 [JP] Japan ................................ 63-61789
Sep. 1, 1988 [JP] Japan ................................ 63-216391
Sep. 14, 1988 [JP] Japan ................................ 63-228528

[51] Int. Cl.⁵ ............................................. H01L 41/08
[52] U.S. Cl. ............................... 310/313 A; 310/313 R
[58] Field of Search ......... 310/313 R, 315 A, 313 D; 333/150, 154, 193

[56] References Cited

U.S. PATENT DOCUMENTS 4,511,816  4/1985  Mikoshiba et al. ............. 310/313 A
4,516,049  5/1985  Mikoshiba et al. ............. 310/313 A
4,567,393  1/1986  Asai et al. ....................... 310/313 A
4,571,519  2/1986  Kawabata et al. .............. 310/313 A
4,752,709  6/1988  Fujishima et al. .............. 310/313 A
4,952,832  8/1990  Imai et al. ....................... 310/313 A Primary Examiner—Mark O. Budd
Attorney, Agent, or Firm—Staas & Halsey

[57] ABSTRACT

IDT electrodes (4) are provided in a two-layer structure of a diamond crystal (2) in an AlN thin film (3) so that a third Rayleigh wave or a Sezawa wave propagates in the two-layer structure. Or else, a third Rayleigh wave propagates in a substrate of a three-layer structure wherein a $SiO_2$ film is provided between a diamond crystal (2) or an AlN thin film (3). SAW devices which have high electromechanical coupling coefficients and high phase velocities are obtained based on those structures. A SAW device in which a third Rayleigh wave propagates is suitable for a narrowband timing tank filter or bandpass filter which is used in a microwave region of several GHz to 20 GHz. A SAW device in which a Sezawa wave propagates is suitable for a wideband voltage-controlled oscillator or a wide bandpass filter which is used in a wide frequency range from the VHF-band to the UHF-band.

24 Claims, 26 Drawing Sheets

D≪H

D≫H (0001)AlN / (001)[100]C
kH = 1.5

RELATIVE DISPLACEMENT AMPLITUDE FOR SEZAWA WAVE (0001)AlN / (001)[100] C
kH = 2.0

RELATIVE DISPLACEMENT AMPLITUDE FOR SEZAWA WAVE (0001)AlN / (001)[100] C

RELATIVE DISPLACEMENT AMPLITUDE FOR SEZAWA WAVE $V_1 < V_2 < V_3$ $V_2 \ll V_1 < V_3$

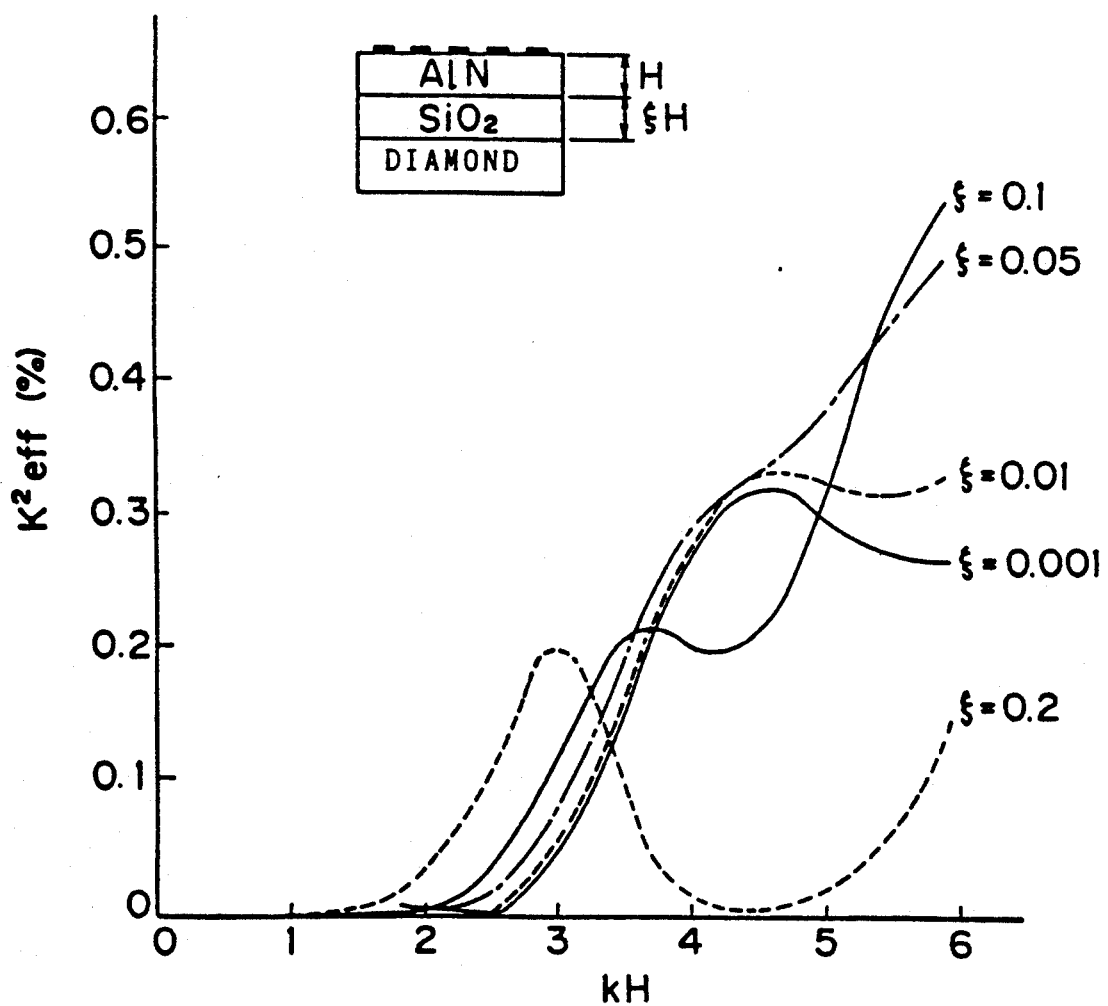

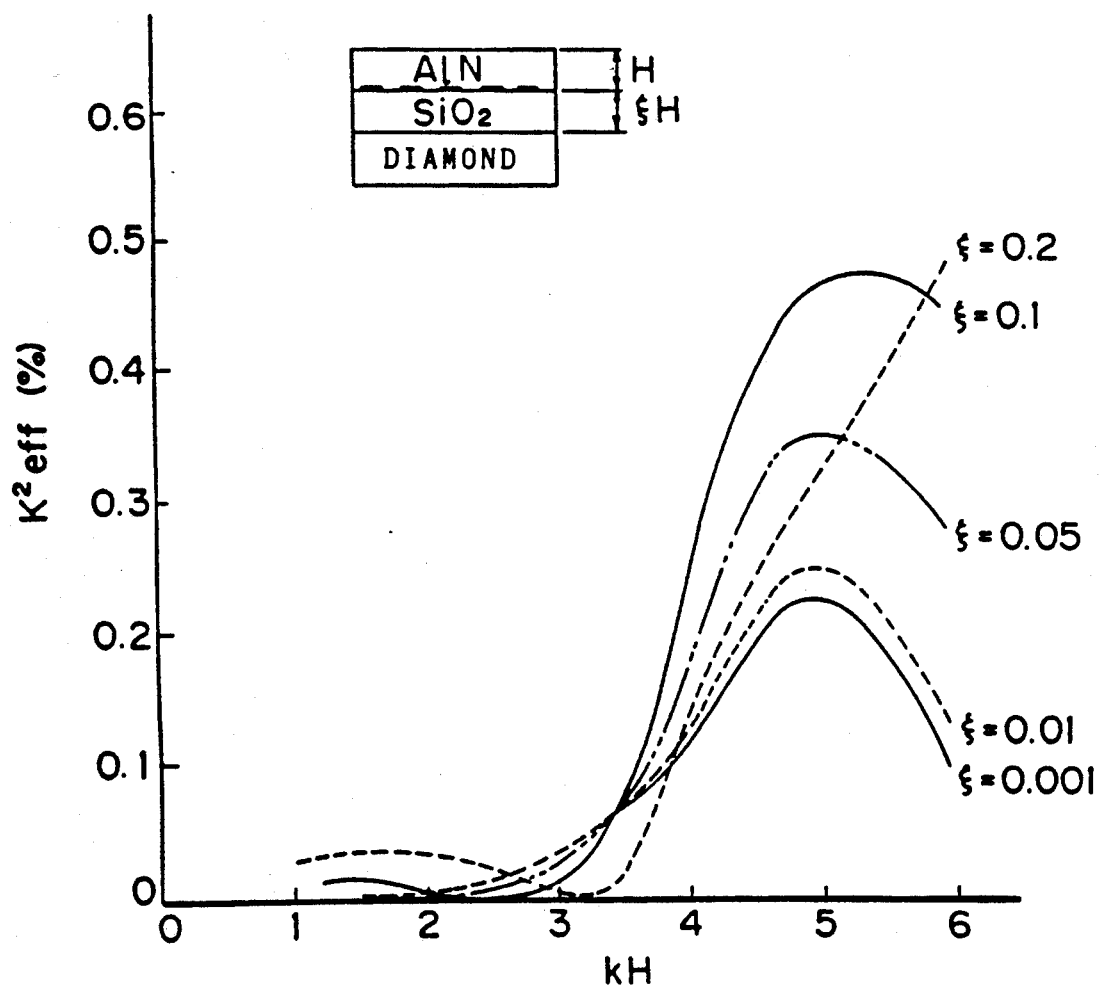

SURFACE ACOUSTIC WAVE DEVICE

This application is a continuation of application Ser. No. 07/444,158, filed as PCT JP/89/00283, Mar. 16, 1989, published as WO/89/08949, Sep. 21, 1989, now abandoned.

BACKGROUND OF THE INVENTION

1. Field of the Invention

This invention relates to a surface acoustic wave device (SAW device) which employs a piezoelectric thin film, and more particularly to a SAW device which is high in stability and easy to produce for realizing a narrowband timing tank filter or bandpass filter for use in a microwave region of several GHz to 20 GHz or a wideband voltage-controlled oscillator or a wide bandpass filter which is used in a wide frequency range from the VHF-band to the UHF-band.

2. Description of the Related Art

There is a tendency that transinformation content progressively increases as optical communication spreads, and the frequency of transmission signals is being expanded to a microwave region. At present, the development of ultra-high speed optical communication systems of several GHz to 20 GHz-band is in progress. However, since highly stable timing tank filters or bandpass filters for several GHz to 20 GHz-band are necessary to optical repeaters for several GHz to 20 GHz-band, it is a current subject to realize them with SAW devices.

Since generally the finger width d of interdigital transducer electrodes (IDT electrodes) employed in SAW devices and the wave length $\lambda$ of a surface acoustic wave (SAW) have a relationship of $d=\lambda/4$, the phase velocity $V_P$, the frequency f of the propagating SAW and the finger width d of the IDT electrodes have a relationship of $f=V_P/4d$.

When IDT electrodes are to be formed making use of the electron beam or the photo-lithography techniques wherein far-ultraviolet radiation is employed as a light source, since there is a limitation in reduction of the finger width d of IDT electrodes, it is necessary to raise the phase velocity $V_P$ of the SAW in order to realize SAW devices wherein the frequency f ranges from several GHz to 20 GHz.

In recent years, many investigations and many proposals have been made to realize GHz-band SAW filters, however, only 1.8 GHz-band SAW filters have been put into practical use wherein the phase velocity (propagation velocity) $V_P$ of SAWs is about 5,000 m/sec. For such conventional 1.8 GHz-band SAW filter, since the finger width d ($d=\lambda/4$) of IDT electrodes can be about 0.7 $\mu$m, an electrode pattern can be formed using the photo-lithographic techniques wherein far-ultraviolet radiation is employed as a light source.

However, if it is intended to realize, for example, a 7 GHz SAW filter with the structure of such conventional SAW filter, it is necessary to make the finger width d of the IDT electrodes smaller than a minimum value of 0.35 $\mu$m which can be attained by the photo-lithography based on far ultraviolet exposure. Accordingly, it cannot be realized by such technique.

In short, since the minimum finger width d of IDT electrodes which can be realized by the present photolithography technique base on far-ultraviolet exposure is about 0.35 $\mu$m, in order to realize a SAW filter for 7 GHz wherein the IDT electrodes can be formed using the above-mentioned technique, it is necessary to make the propagation velocity (phase velocity) $V_P$ of a SAW equal to about 10,000 m/sec at least ($V_P=7$ GHz $\times 4d \geq 9,800$ m/sec $\approx 10,000$ m/sec).

On the other hand, in order to realize a narrowband SAW filter (loaded $Q_L=1,000$) for use as a timing tank filter for 7 GHz-band, it is necessary to set the effective electromechanical coupling coefficient $K^2_{eff}$ of SAWs to a value greater than or equal to 0.1%, and preferably the effective electromechanical coupling coefficient $K^2_{eff}$ is set to a value greater than or equal to that of SAW in ST cut quartz, that is, is 0.15% or more ($K^2_{eff} \geq 0.15\%$).

Meanwhile, if it is considered that a plane (100) or plane (110) Si single-crystal, a plane (100) GaAs single-crystal or the like is used for a substrate of an LSI (large scale integrated circuit), in order to enable SAW devices to be integrated with LSIs therearound, it is necessary to realize the SAW devices constructed directly on a single-crystal semiconductor substrate, for example, a Si single-crystal, a GaAS single-crystal or the like.

However, since a Si single-crystal is a non-piezoelectric crystal of the cubic system and a GaAs single-crystal is a weak piezoelectric crystal of the cubic system, even if IDT electrodes are provided directly on a single-crystal semiconductor substrate, that is, a Si single-crystal or a GaAs single-crystal, the SAW will not be excited or will be excited but very weakly. Therefore, it is desirable to realize a SAW device of a composite substrate structure which includes at least a piezoelectric thin film and a single-crystal semiconductor substrate, that is, a Si single-crystal or a GaAs single-crystal.

Taking a summary of the foregoing aims, the characteristics required for a SAW device with which a narrowband timing tank filter or bandpass filter for use in a microwave region of several GHz to 20 GHz is realized are:

(1) $V_P \geq 10,000$ m/sec; and
(2) $K^2_{eff} \geq 0.15\%$.

Further, the requirement in integration of such SAW device with an LSI is that the SAW device has a composite substrate structure which includes at least a single-crystal semiconductor substrate and a piezoelectric thin film.

By the way, in order to realize wideband voltage controlled oscillator, a wide bandpass filter or the like over a wide frequency range from the VHF-band to the UHF-band using SAW devices, it is necessary to select piezoelectric materials having a high effective electromechanical coupling coefficient $K^2_{eff}$ ($K^2_{eff} \geq 0.5\%$ as an aim).

Meanwhile, in order to produce such SAW devices at a low cost, it is necessary to make it possible to form IDT electrodes by the ordinary photo-lithography technique wherein an ultraviolet exposure device is employed as a light source. To this end, it is necessary for the IDT electrodes to have a finger width d ($d=\lambda/4$) greater than or equal to 1.0 $\mu$m which is a possible minimum value in the case of the ordinary technique. In this instance, in order to realize SAW devices over a wide high frequency range from the VHF-band (100 MHz or so) to the UHF-band (2.0 GHz or so), it is necessary for the SAW to have a propagation velocity (phase velocity) $V_P$ higher than or equal to nearly 8,000 m/sec ($V_P=2.0$ GHz $\times 4d = 8,000$ m/sec).

Further, in recent years, as peripheral circuits of such SAW devices are LSIs, it is demanded for SAW devices to be integrated with LSIs.

Taking a summary of the foregoing aims, the characteristics required for SAW devices with which a wideband voltage controlled oscillator, a wide bandpass filter or the like for use over a wide frequency region from the VHF-band to the UHF-band is realized are:
(1) $V_P \geq 8,000$ m/sec; and
(2) $K^2_{eff} \geq 0.5\%$.

Further, the requirement in integration of such SAW device with LSIs is that the SAW device has a composite substrate structure which includes at least a single-crystal semiconductor substrate and a piezoelectric thin film.

SUMMARY OF THE INVENTION

Taking such technical background as described above into consideration, it is an object of the present invention to provide SAW devices which are high in stability and easy to produce for realizing narrowband timing tank filters or bandpass filters for use in a microwave region of several GHz to 20 GHz.

It is another object of the present invention to provide SAW devices which are high in stability and easy to produce for realizing wideband voltage-controlled oscillators or wide bandpass filters for use over a wide frequency range from the VHF to the UHF.

When the present invention is considered from a certain aspect, there is provided, as a first basic form of a SAW device of the present invention, a SAW device which comprises a diamond crystal and an aluminum nitride (AlN) thin film formed on the diamond crystal and wherein SAWs propagate on the structure.

Desirably, IDT electrodes are formed on the AlN thin film.

In order to realize a narrowband timing tank filter or bandpass filter for use in a microwave region using a SAW device according to the first basic form of the present invention, the thickness H of the AlN thin film is set to a value which satisfies the expression $$3.5 \leq kH \leq 5.0$$

where k is a wave number, and among SAWs which propagate on the AlN thin film/diamond crystal, a third Rayleigh wave is utilized.

In this instance, where the diamond crystal is a diamond crystal thin film formed on a single-crystal semiconductor substrate, the thickness D of the diamond crystal thin film and the thickness H of the AlN thin film have the relationship of $$D \geq 4H$$

In order to realize a wideband voltage-controlled oscillator, a wide bandpass filter or the like using a SAW device according to the first basic form of the present invention, the thickness H of the AlN thin film is set to a value which satisfies the expression $$1.1 \geq kH \geq 6.0$$

where k is a wave number, and among SAWs which propagate on the AlN thin film/diamond crystal, a Sezawa wave is utilized.

In this instance, where the diamond crystal is a diamond crystal thin film formed on a single-crystal semiconductor substrate, the thickness of the diamond crystal thin film D and the thickness H of the AlN thin film have the relationship of $$D \geq 5H$$

When the invention is considered from another certain aspect, a SAW device according to a second basic form of the present invention is comprised of a diamond crystal, a silicon dioxide ($SiO_2$) thin film formed on the diamond crystal, and an AlN thin film formed on the $SiO_2$ thin film, and SAWs propagate in a three-layer structure comprised of the diamond crystal, $SiO_2$ thin film and AlN thin film.

Desirably, the thickness T of the $SiO_2$ thin film has the following relationship to the thickness H of the AlN thin film:

$$0.01H \geq T \geq 0.1H$$

Further, desirably the diamond crystal is a diamond crystal thin film formed on the single-crystal semiconductor substrate.

When IDT electrodes are to be formed on the AlN thin film of a SAW device according to the second basic form of the present invention, the thickness H of the AlN thin film is set to a value which satisfies the expression $$3.2 \geq k H \geq 4.7$$

where k is a wave number, and among SAWs which propagate in the aforementioned three-layer structure, a third Rayleigh wave is utilized.

When IDT electrodes are to be formed on the interface between the AlN thin film and the $SiO_2$ thin film of a SAW device according to the second basic form of the present invention, the thickness H of the AlN thin film is set to a value which satisfies the expression $$3.7 \geq k H \geq 4.7$$

where k is a wave number, and among SAWs which propagate in the three-layer structure, a third Rayleigh wave is utilized.

BRIEF DESCRIPTION OF THE DRAWINGS

FIG. 33 is a diagram illustrating kH dependency of the effective electromechanical coupling coefficients $K^2_{eff}$ of a third Rayleigh wave in the three-layer structure of FIG. 31; and FIG. 34 is a diagram illustrating a kH dependency of the effective electromechanical coupling coefficients $K^2_{eff}$ of a third Rayleigh wave in the three-layer structure of FIG. 32.

DESCRIPTION OF THE PREFERRED EMBODIMENTS

In the following, embodiments of the present invention and reasons behind the design of the embodiments will be described in detail with reference to the drawings.

A ZnO thin film, an AlN thin film or the like is commonly used as a material of piezoelectric thin film. A ZnO thin film has been an object of investigation from early on. Thus, a two-layer structure composed of a ZnO thin film and a Si single-crystal is examined here.

Figure 1:
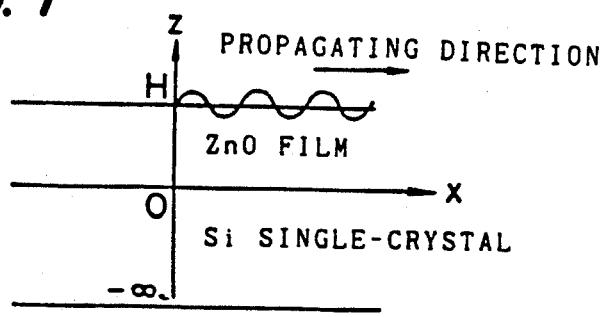
FIG. 1 is a diagrammatic representation showing axes of coordinate system and a two-layer structure composed of a ZnO thin film and a Si single-crystal.
Figure 2:
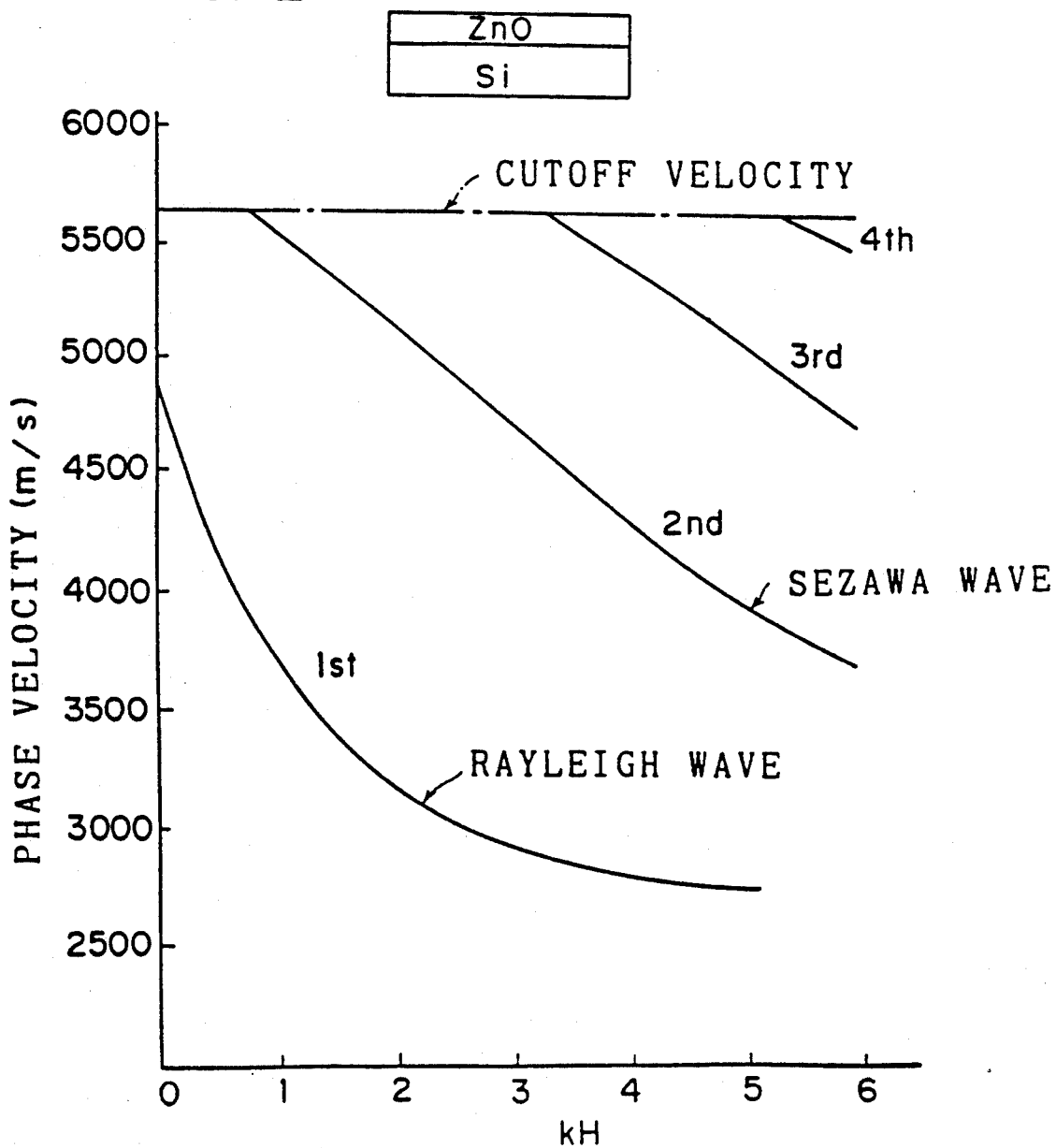
FIG. 2 is a diagram illustrating a kH dependency of the phase velocity of SAWs in a two-layer structure composed of a ZnO thin film and a Si single-crystal.

FIG. 1 shows axes of coordinates and a two-layer structure composed of a ZnO thin film and a Si single-crystal, and FIG. 2 is a diagram showing results of an analysis of dispersion characteristics for SAWs in the structure of FIG. 1. A dependency of the propagation velocity (phase velocity) $V_P$ of a SAW upon the product kH of a wave number k of a SAW (Rayleigh wave and Sezawa wave) and a thickness H of a ZnO thin film can be seen from FIG. 2.

In order to grow a ZnO thin film in the C-axis direction by sputtering, it is necessary for a SAW device to actually have a three-layer structure comprising a ZnO thin film, a SiO thin film and a Si single-crystal. However, since such $SiO_2$ has a sufficiently small thickness, it does not have a significant influence on the SAW characteristics. Accordingly, there is no essential difference even if dispersion characteristics of SAWs in a two-layer structure comprised of a ZnO thin film and a Si single-crystal are analyzed.

As can be seen from FIG. 2, whichever of a Rayleigh wave and a Sezawa wave is used, the phase velocity $V_P$ remains within the range of 2,700 m/sec $\geq V_P \geq$ 5,500 m/sec. Consequently, the aims of the present embodiment cannot be attained. This arised from the fact that the phase velocity of a bulk thickness shear wave in only ZnO is about 2,700 m/sec and lower. Therefore, it is not desirable to employ a ZnO thin film.

Meanwhile, an AlN thin film is inferior in regard to the piezoelectricity. However, it has such a high performance that the phase velocity $V_P$ of a SAW therein is about 5,600 m/sec and the phase velocity $V_P$ of a bulk thickness shear wave is about 6,000 m/sec. Accordingly, such AlN thin film is hopeful.

Figure 3:
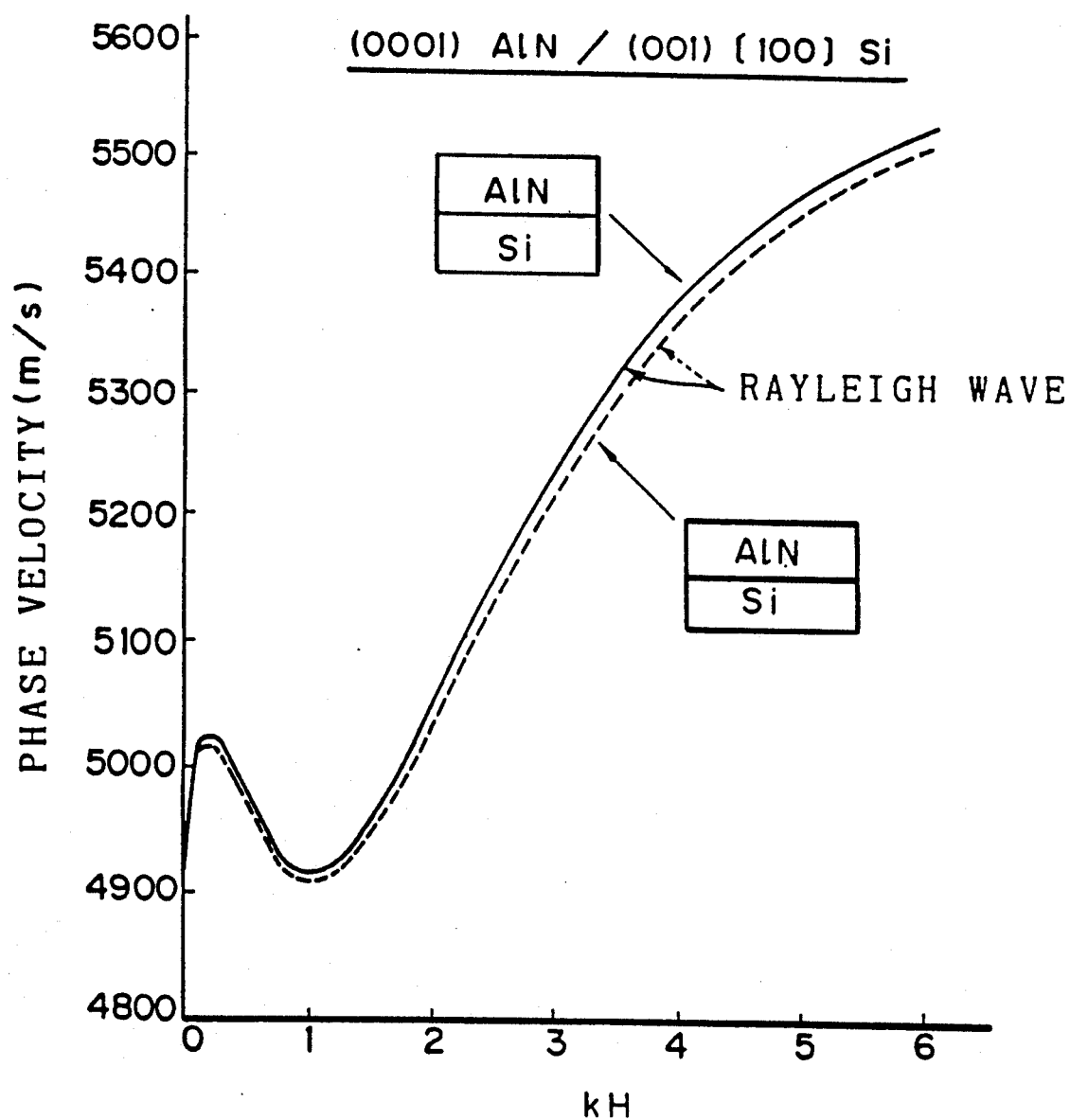
FIG. 3 is a diagram illustrating a kH dependency of the phase velocity of a SAW in a two-layer structure composed of a plane (0001) AlN thin film and a plane (001) direction [100] Si single-crystal.

Thus, a two-layer structure comprised of an AlN thin film and a Si single-crystal is examined here. FIG. 3 is a diagram showing dispersion characteristics of a SAW in a two-layer structure comprised of an AlN thin film and a Si single-crystal. The relationship between the axes of coordinates and the two-layer structure comprised of an AlN thin film and a Si single-crystal is similar to that in FIG. 1.

It can be seen from FIG. 3 that the phase velocity $V_P$ in a two-layer structure comprised of an AlN thin film and a Si single-crystal remains within the range of 4,900 m/sec $< V_P <$ 5,600 m/sec, and accordingly, it is still impossible to attain the aims of the present invention. This is because the phase velocity $V_P$ of a bulk thickness shear wave in the Si single-crystal used as a substrate is slow at about 5,840 m/sec ($V_P$=4.910 m/sec with a Rayleigh wave) and besides the phase velocity $V_P$ of a Rayleigh wave in the AlN thin film itself is low.

Figure 4:
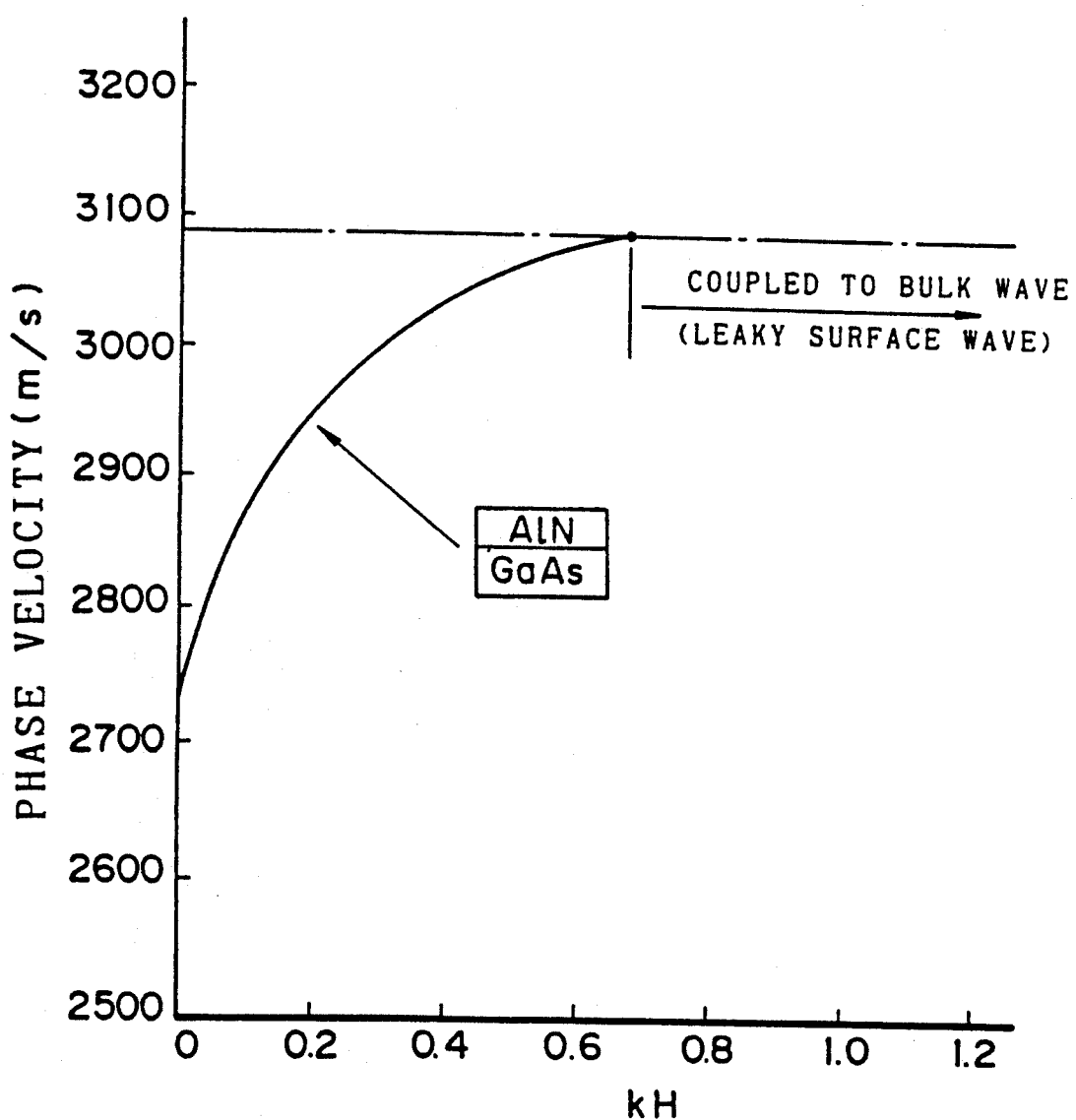
FIG. 4 is a diagram illustrating a kH dependency of the phase velocity of a SAW in a two-layer structure composed of a (0001) AlN thin film and a (001) [100] GaAs single-crystal.

A similar problem takes place where a GaAs single-crystal belonging to the cubic system is employed. FIG. 4 is a diagram showing a dispersion characteristic of a SAW in a two-layer structure comprised of an AlN thin film and a GaAs single-crystal. As can be seen from FIG. 4, the phase velocity $V_P$ remains within the range of 2,700 m/sec $< V_P <$ 3,100 m/sec, and at a higher velocity (about 3,086 m/sec), a SAW will be coupled to bulk waves in the GaAs single-crystal to make a leaky surface wave.

It can be seen from the foregoing results of analysis that a Si single-crystal or a GaAs single-crystal is unsuitable as an elastic material. Therefore, it is desirable that a SAW is prevented from penetrating into a Si single-crystal or a GaAs single-crystal.

Figure 5:
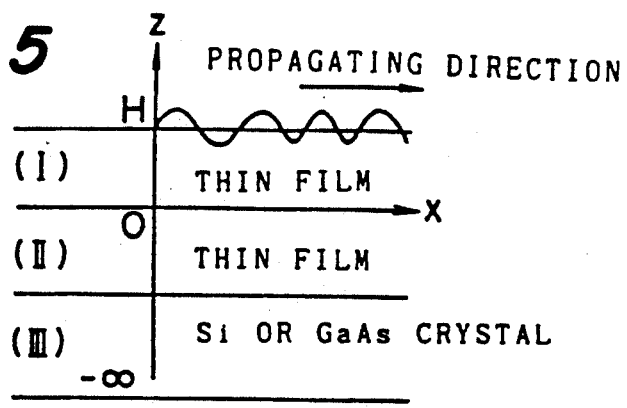
FIG. 5 is a diagrammatic representation showing axes of coordinate system and a three-layer structure composed of a single-crystal semiconductor substrate formed from a Si single-crystal, a GaAs single-crystal or the like and two thin film layers.

Thus, a SAW device of a three-layer structure shown in FIG. 5 will be examined wherein a SAW is enclosed only in two layers of an upper layer I and an intermediate layer II. The upper layer I is an AlN thin film orientated to the C-axis. Such AlN thin film orientated to the C-axis can be formed by a PVD method such as magnetron sputtering or the like or a CVD method. If the phase velocities of a Rayleigh wave and a bulk shear wave in the upper layer I are represented by $V_{1R}$ and $V_{1S}$ and the phase velocities of a Rayleigh wave and a bulk thickness shear wave in the intermediate layer II are represented by $V_{2R}$ and $V_{2S}$, respectively, then it is perceived that, when the relationship of $V_{1R} < V_{1S} < < V_{2R} < V_{2S}$ stands, a third Rayleigh wave which velocity is higher than that of a first Rayleigh wave is excited in addition to a first Rayleigh wave. Further, notice is taken of a diamond single-crystal thin film or a diamond polycrystal thin film as the intermediate layer II. A diamond single-crystal or polycrystal thin film can be formed synthetically on a single-crystal semiconductor substrate or a glass substrate by a CVD method using methane gas and hydrogen gas ($CH_4 + H_2$) or by a PVD method by ion beam sputtering or the like. Such diamond crystal thin films have such a high performance that the phase velocity $V_P$ of a Rayleigh wave therein is about 11,500 m/sec and the phase velocity $V_P$ of a bulk thickness shear wave is about 12,800 m/sec.

Therefore, in the first basic form of the present invention, a two-layer structure comprised of a diamond crystal and an AlN thin film, or desirably a three-layer structure composed of a single-crystal semiconductor substrate of a Si single-crystal, a GaAs single-crystal or the like a diamond crystal thin film and an AlN thin film, is employed.

Figure 6:
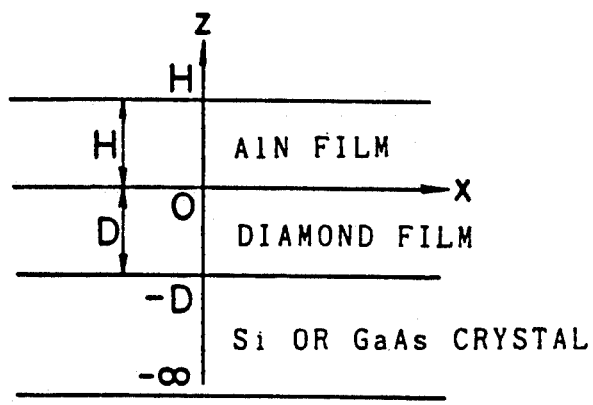
FIG. 6 is a diagrammatic representation showing axes of coordinate system and a three-layer structure composed of a single-crystal semiconductor substrate formed from a Si single-crystal, a GaAs single-crystal or the like, a diamond crystal thin film and an AlN thin film.
Figure 7A:
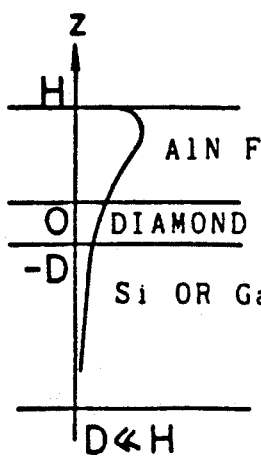
FIGS. 7A and 7B are diagrams illustrating relationships between a thickness of a diamond crystal thin film with respect to an AlN thin film and a penetration depth of a SAW.

FIG. 6 shows axes of coordinates and a three-layer structure comprised of a single-crystal (Si or GaAs), a diamond crystal thin film and an AlN thin film. In the three-layer composite structure, where the thickness of the diamond crystal thin film is represented by D and the thickness of the AlN thin film is represented by H, if the thickness D of the diamond crystal thin film is $D << H$ compared with the thickness H of the AlN thin film as shown in FIG. 7A, then a SAW will penetrate into Si or GaAs crystal and be coupled strongly to bulk waves in Si or GaAs. Accordingly, $V_P$=10,000 m/sec which is one of the aimed values cannot be realized.

Figure 7B:
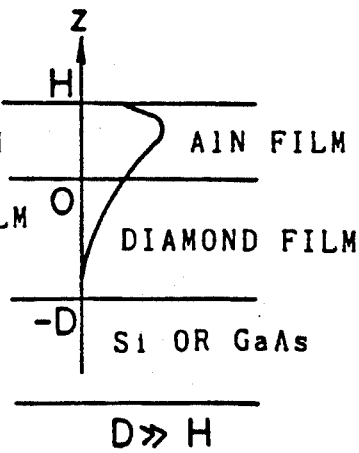

On the other hand, if $H << D$ is established as shown in FIG. 7B, then a SAW will be enclosed only in the two-layer films, the diamond crystal thin film and the AlN thin film. Accordingly, an ultra high speed SAW having a phase velocity higher than 10,000 m/sec can be realized.

Thus, at first, SAWs which propagate in a two-layer structure composed of a diamond crystal thin film and an AlN thin film such that the diamond crystal thin film is formed with a sufficiently great thickness ($H << D$) will be analyzed.

It is assumed that a SAW propagates in parallel to a surface of a substrate, that is, in the [100] direction. An analysis can be made by a large computer applying boundary conditions of individual boundary surfaces to a field equation.

Figure 8:
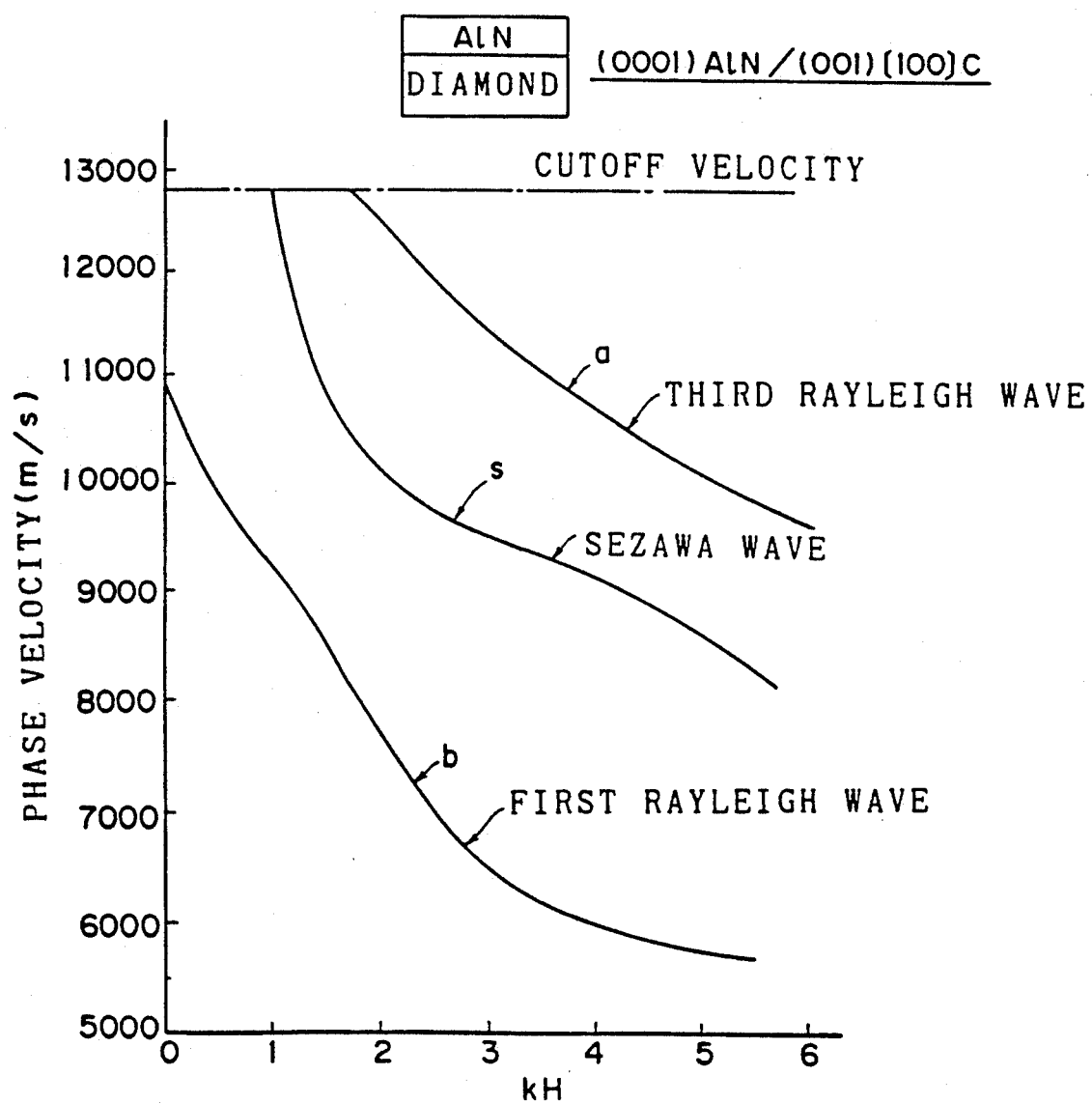
FIG. 8 is a diagram illustrating a kH dependency of the phase velocity of SAWs in a two-layer structure composed of a (0001) AlN thin film and a (001) [100] diamond crystal thin film.

FIG. 8 is a diagram showing results of analysis of SAW dispersion characteristics versus the product kH of a thickness H of the AlN thin film in the two-layer structure composed of the diamond crystal thin film and the AlN thin film and a wave under k of a SAW.

In FIG. 8, the curve b shows a fundamental Rayleigh wave mode. The first Rayleigh wave behaves like a symmetrical Lamb wave in the AlN thin film. On the other hand, the curve a shows a third Rayleigh wave mode and is excited at $kH \geq 1.7$.

Within the range of $kH \leq 6$, Rayleigh modes equal to the fifth degree or more and higher degree Sezawa modes are coupled to bulk waves in the diamond crystal thin film to make leaky surface waves.

At first, an investigation is made of conditions required for SAW devices which are high in stability and easy to produce for realizing narrowband timing tank filters or bandpass filters for use in a microwave region of several GHz to 20 GHz in the first basic form of the present invention. The conditions are:

$V_P \geq 10,000$ m/sc;

and $K^2_{eff} \geq 0.15\%$

From FIG. 8, the condition for satisfying $V_P \geq 10,000$ m/sec is $0 \leq kH \leq 0.4$ where a first Rayleigh wave is used, but $1.7 < kH \leq 5.0$ where a third Rayleigh wave is used.

Thus, at first, an examination is made of the case wherein a first Rayleigh wave is used, and an investigation is made of the possibility of realization of the aimed value ($K^2_{eff} \geq 0.15$) of the effective electromechanical coupling coefficient $K^2_{eff}$ for satisfying the condition of a loaded $Q_L$ = 1,000.

When the kH dependency of the effective electromechanical coupling coefficient $K^2_{eff}$ of a first Rayleigh wave is examined, four configurations of electrodes are available. In particular, the first configuration is a construction wherein IDT electrodes are provided on the interface between a diamond single-crystal thin film and an AlN thin film; the second configuration is a construction wherein IDT electrodes are formed on an AlN thin film; the third configuration is a construction wherein IDT electrodes are provided on the interface between a diamond crystal thin film and an AlN thin film, and a grounded electrode is provided on the AlN thin film; and the fourth configuration is a construction wherein IDT electrodes are provided on an AlN thin film and a grounded electrode is provided on interface between a diamond crystal thin film and the AlN thin film.

Figure 9:
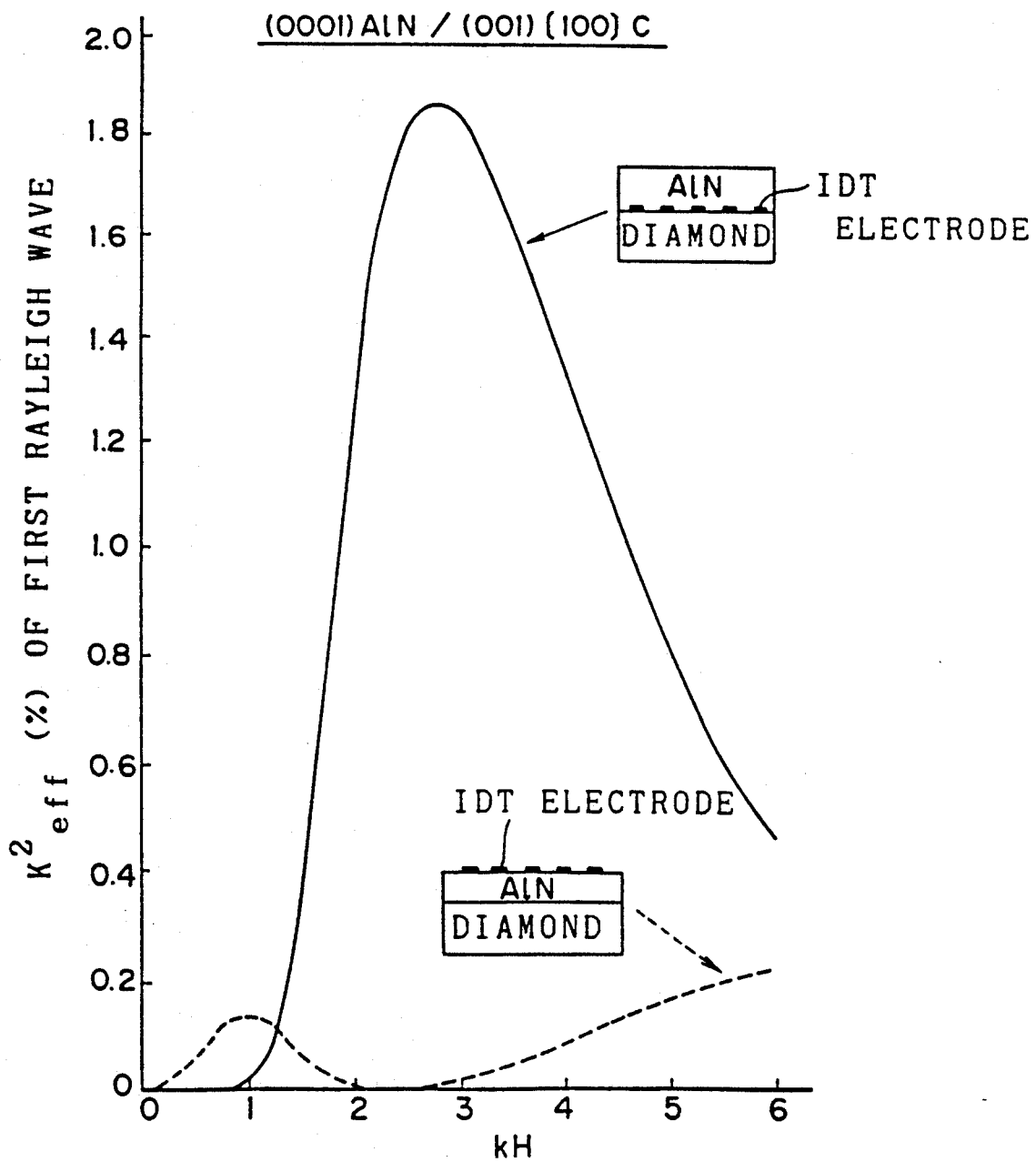
FIGS. 9 and 10 are diagrams illustrating kH dependencies of the effective electromechanical coupling coefficients $K^2_{eff}$ for a first Rayleigh wave in a two-layer structure composed of a (0001) AlN thin film and a (001) [100] diamond crystal thin film.
Figure 10:
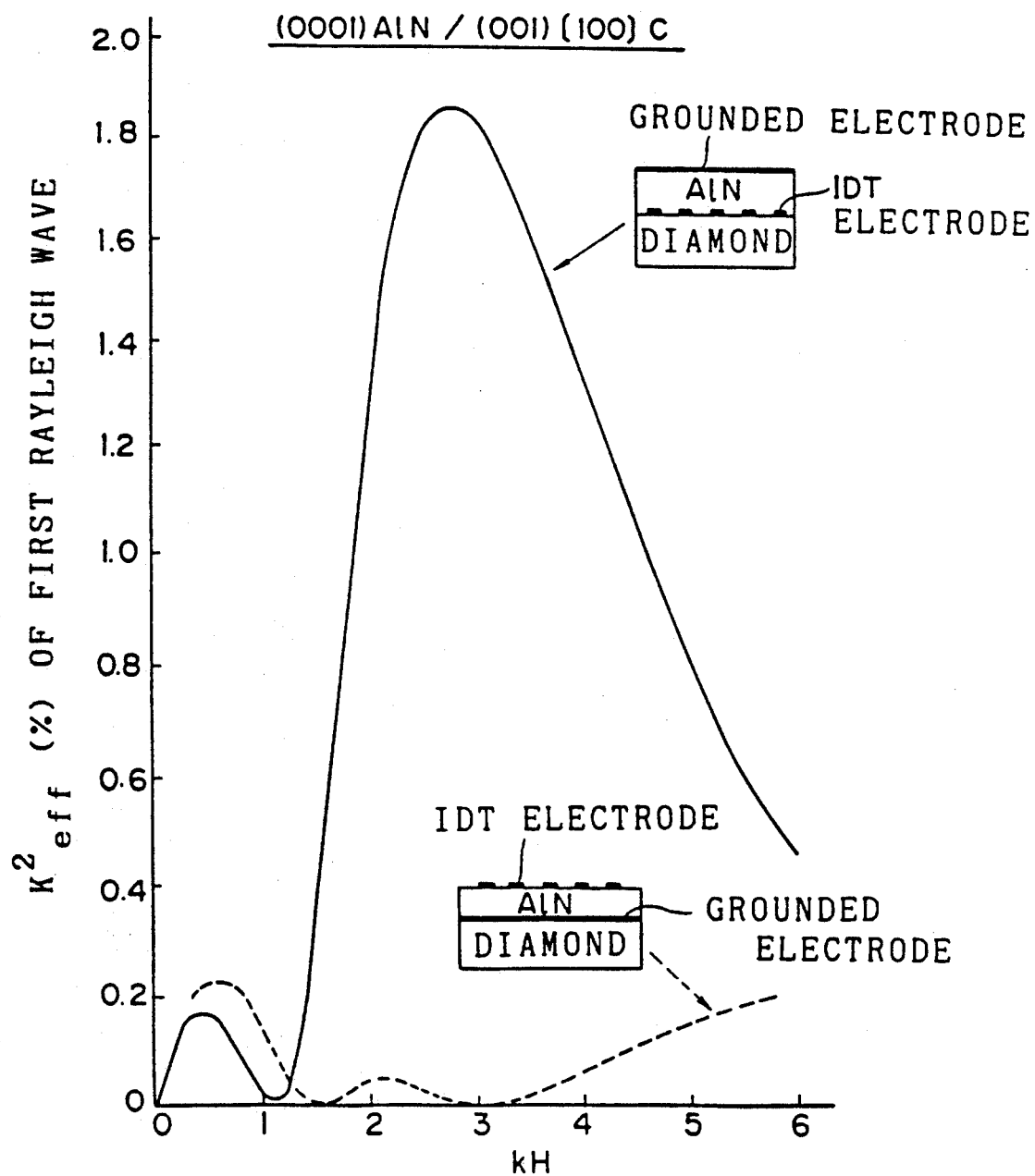

FIGS. 9 and 10 are diagrams showing results of analysis of a kH dependency of the effective electromechanical coupling coefficients $K^2_{eff}$ for a first Rayleigh wave where the four electrode configurations described above are adopted. The effective electromechanical coupling coefficient $K^2_{eff}$ makes a barometer regarding an intensity with which a SAW can be excited piezoelectrically.

In order to meet the condition of a loaded $Q_L = 1,000$ to make a narrowband SAW filter, it is necessary to set the effective electromechanical coupling coefficient $K^2_{eff}$ to a value equal to or greater than 0.15%. Accordingly, in order to satisfy the condition of $0 \leq kH \leq 0.4$ described above, in the case of the IDT electrode configuration shown in FIG. 10, kH comes to a value within the very limited range from 0.3 to 0.4, and it is difficult to control the film thickness to a value within such range.

Figure 11:
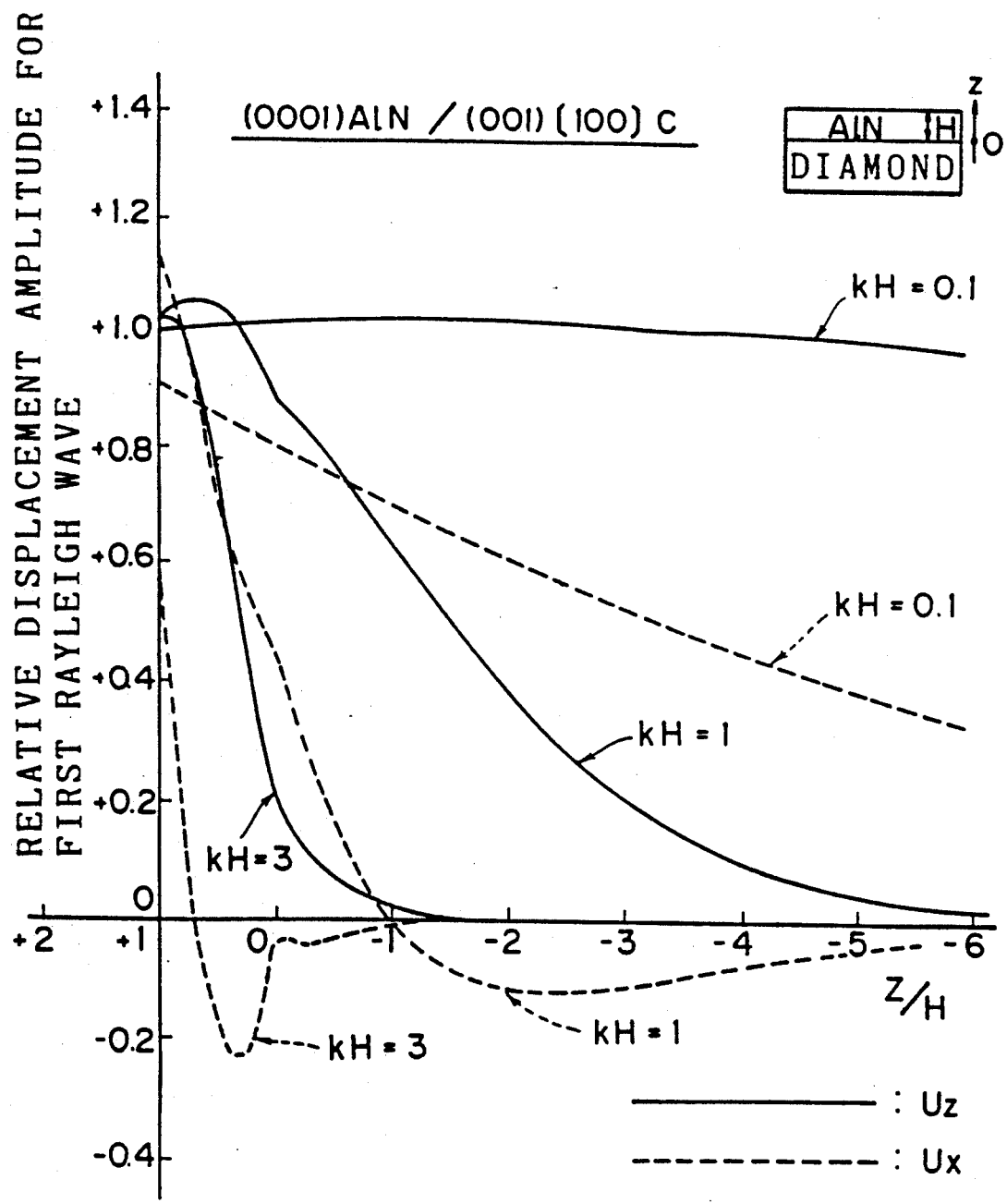
FIG. 11 is a diagram illustrating a depth dependency of the relative displacement amplitudes for a first Rayleigh wave in a two-layer structure composed of a (0001) AlN thin film and a (001) [100] diamond crystal thin film.

Further, FIG. 11 is a diagram showing results of analysis of a depth (Z-axis direction) dependency of the relative displacement amplitude for a first Rayleigh wave. In FIG. 11, the axis of abscissa represents a value Z/H obtained by dividing the distance in the Z-axis direction from an interface between a diamond crystal thin film and an AlN thin film by the thickness H of the AlN thin film, while the axis of ordinate represents a relative displacement amplitude value for a first Rayleigh wave. In FIG. 11, each solid line curve represents a relative amplitude value $U_Z$ regarding a Z-axis component, while each broken line curve represents a relative amplitude value $U_X$ of an X-axis component.

As can be seen from FIG. 11, in the case of $kH \leq 0.4$, a first Rayleigh wave penetrates deeply into a diamond crystal thin film. Accordingly, in order to enclose a first Rayleigh wave only in the two layers of the diamond crystal thin film and the AlN thin film, it is necessary for the thickness D of the diamond crystal thin film to be much greater than 6 times the thickness H of the AlN thin film (D>>6H). This is difficult in production and is not preferably from the point of view of the production process and the cost. Therefore, it is considered difficult to realize the aims of $V_P \geq 10,000$ m/sec and $K^2_{eff} \geq 0.15\%$ making use of a first Rayleigh wave.

Figure 12:
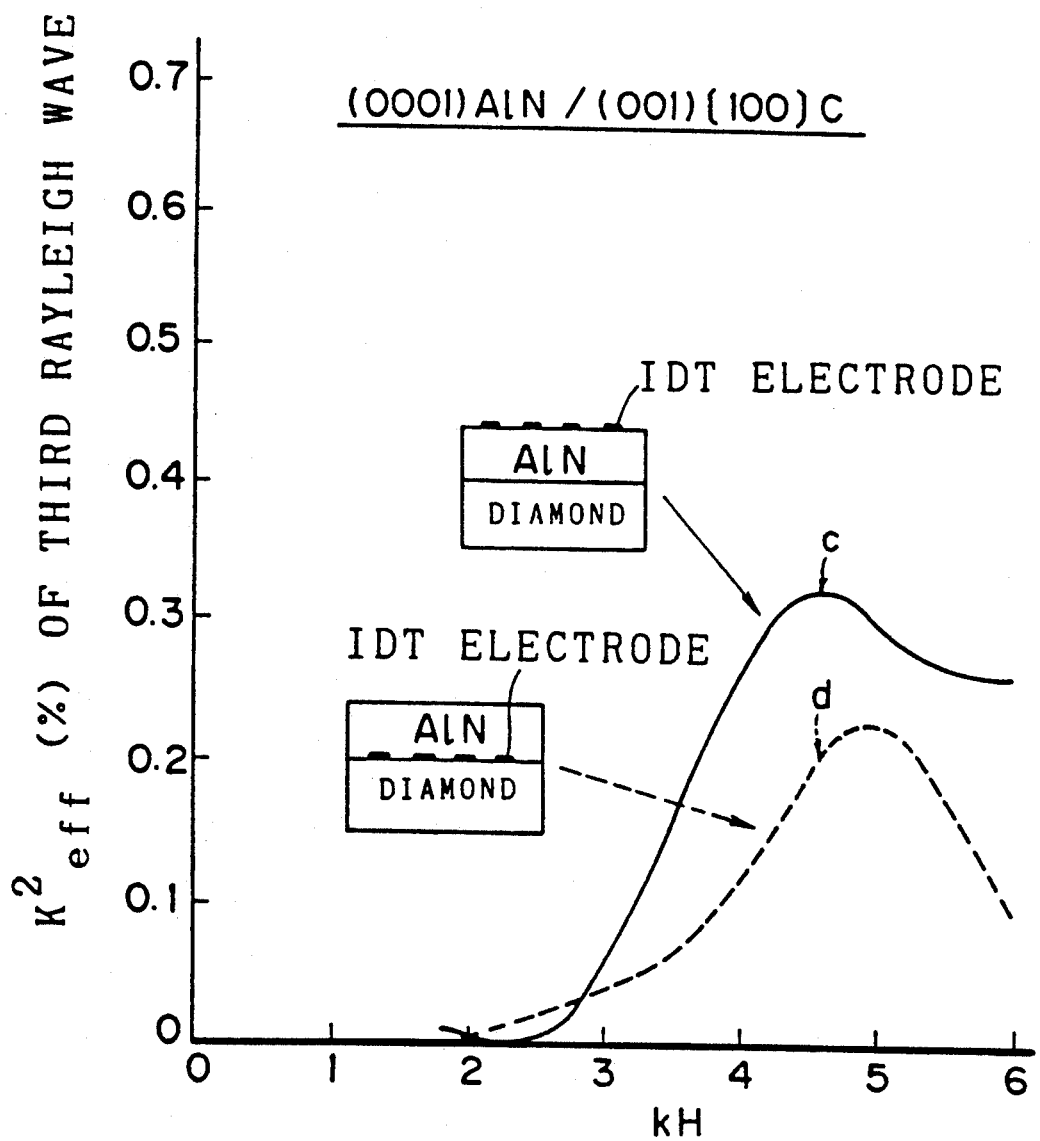
FIGS. 12 and 13 are diagrams illustrating kH dependencies of the effective electromechanical coupling coefficients $K^2_{eff}$ of a third Rayleigh wave in a two-layer structure composed of a (0001) AlN thin film and a (001) [100] diamond crystal thin film.
Figure 13:
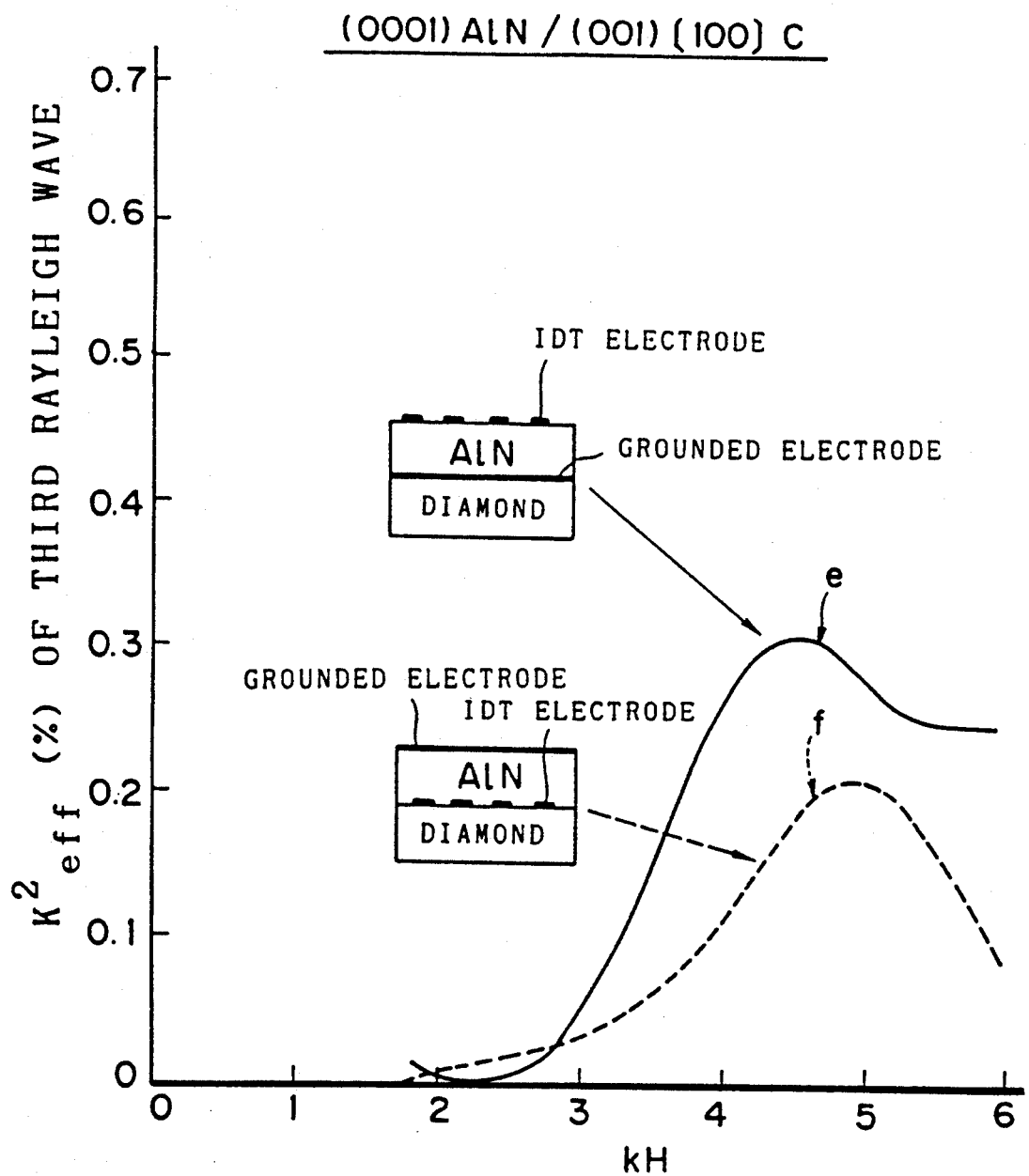

Accordingly, a third Rayleigh wave is used in order to provide a SAW device which is high in stability and easy to produce for realizing a narrowband timing tank filter or bandpass filter for use in a microwave region. FIGS. 12 and 13 are diagrams showing results of analysis of a kH dependency of the effective electromechanical coupling coefficients $K^2_{eff}$ were a third Rayleigh wave is used in the four electrode configurations described above.

Referring to FIG. 12, the curve c represents a kH dependency of the effective electromechanical coupling coefficient $K^2_{eff}$ where IDT electrodes are placed on an AlN thin film. The curve d represents a kH dependency of the effective electromechanical coupling coefficient $K^2_{eff}$ where IDT electrodes are placed on interface between the diamond crystal thin film and the AlN thin film.

On the other hand, referring to FIG. 13, the curve e represents a kH dependency of the effective electromechanical coupling coefficient $K^2_{eff}$ where IDT electrodes are placed on an AlN thin film and a grounded electrode is placed on interface between a diamond crystal thin AlN thin film. The curve f represents a kH dependency of the effective electromechanical coupling coefficient $K^2_{eff}$ were IDT electrodes are placed on boundary surfaces of a diamond crystal thin film and an AlN thin film and a ground electrode is disposed on the AlN thin film.

As described above, in order to meet the condition of $V_P \geq 10,000$ m/sec using a third Rayleigh wave, it is necessary at least to set the thickness H of an AlN thin film to a value which satisfies the condition of $1.7 < kH \leq 5.0$ (refer to FIG. 8). Accordingly, from FIGS. 12 and 13, in order to meet the conditions of $V_P \geq 10,000$ m/sec and $K^2_{eff} \geq 0.15\%$ using a third Rayleigh wave when IDT electrodes are to be formed on an AlN thin film (in the case of the curves c and e), it is necessary to control the thickness H of the AlN thin film to a value which satisfies the condition of $3.5 \leq kH \leq 5.0$.

Meanwhile, when IDT electrodes are placed on interface between an AlN thin film and a diamond crystal thin film (in the case of the curves d and f), in order to meet the conditions of $V_P \geq 10,000$ m/sec and $K^2_{eff} \geq 0.15\%$ using a third Rayleigh wave, it is necessary to control the thickness H of the AlN thin film to a value which satisfies the condition of $4.3 \leq kH \leq 5.0$. In this manner, when compared with the case wherein IDT electrodes are formed on an AlN thin film, the range within which the thickness of an AlN thin film is controlled is smaller, and accordingly, the control of the thickness of an AlN thin film is difficult.

By the way, in a SAW device which makes use of a third Rayleigh wave, any other mode is also excited so that, for example, a fundamental Rayleigh wave mode (first Rayleigh wave) becomes spurious. While it is impossible to suppress the first Rayleigh wave completely, it is desirable to reduce the excitation intensity to reduce the spurious level as far as possible.

Thus, referring again to FIGS. 9 and 10, where IDT electrodes are formed on interface between an AlN thin film and a diamond crystal thin film, in the condition of $4.3 \leq kH \leq 5.0$, the effective electromechanical coupling coefficient $K^2_{eff}$ comes within the range of $0.8\% \leq K^2_{eff} \leq 1.0\%$ and is 4 to 5 times or more the effective electromechanical coupling coefficient $K^2_{eff}$ of a third Rayleigh wave. On the other hand, where IDT electrodes are formed on an AlN thin film, in the condition of $3.5 \leq kH \leq 5.0$, the effective electromechanical coupling coefficient $K^2_{eff}$ of a first Rayleigh wave comes within the range of $0.05\% \leq K^2_{eff} \leq 0.15\%$ and has a substantially similar value to a first Rayleigh wave. Accordingly, in order to suppress the spurious degree of coupling of a first Rayleigh wave, it is necessary to form IDT electrodes on an AlN thin film.

Accordingly, in order to readily realize the aimed value of the phase velocity $V_P$ or a third Rayleigh wave ($V_P \geq 10,000$ m/sec) and the aimed value of the effective electromechanical coupling coefficient $K^2_{eff}$ ($K^2_{eff} \geq 0.15\%$) while suppressing excitation of a spurious first Rayleigh wave in a two-layer structure composed of a diamond crystal and an AlN thin film or in a three-layer structure composed of a Si single-crystal or a GaAs single-crystal, a diamond crystal thin film and an AlN thin film, it is understood that IDT electrodes should be formed on the AlN thin film and the AlN thin film orientated to the C-axis should be formed on the diamond crystal or the diamond crystal thin film by a magnetron sputtering method or the like such that the thickness H of the AlN thin film may meet the condition of $3.5 \leq kH \leq 5.0$.

Subsequently, an investigation is made of a thickness D of a diamond crystal thin film which is necessary, where a diamond crystal is in the form of a thin film formed on a single-crystal semiconductor substrate, to enclose a third Rayleigh wave substantially in a two-layer film of the diamond crystal thin film and an AlN thin film.

Figure 14:
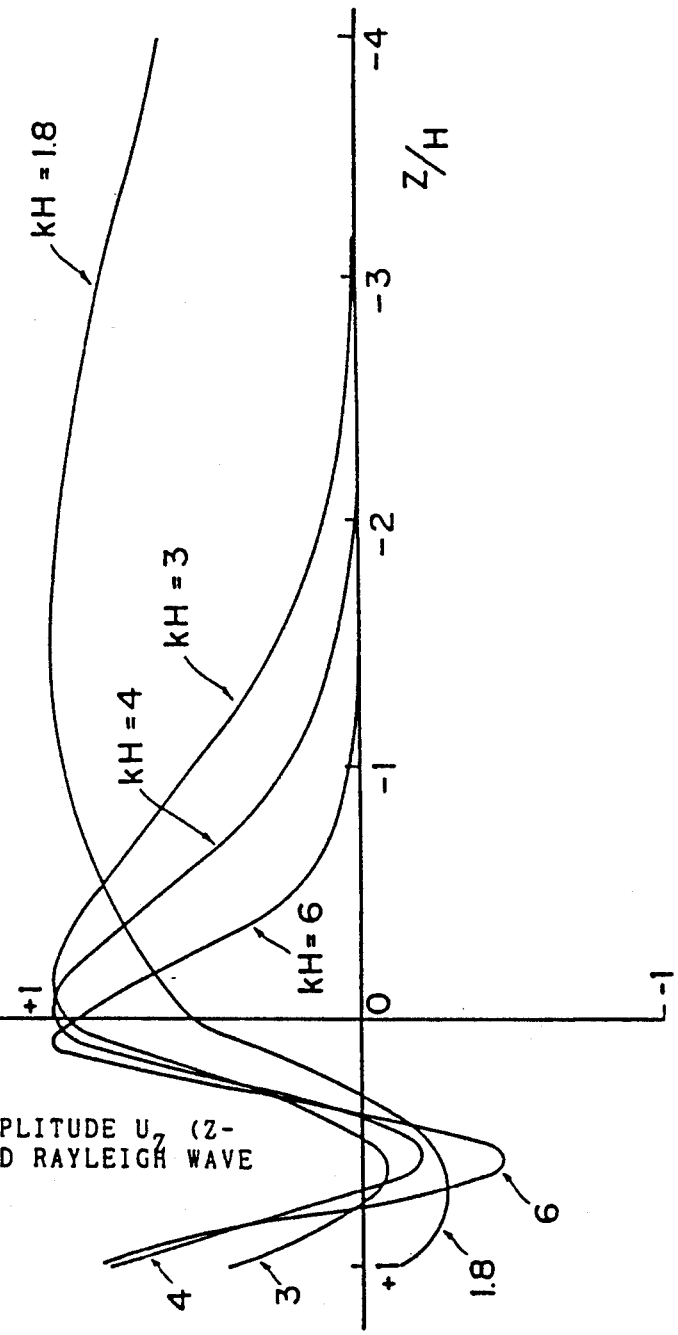
FIG. 14 is a diagram illustrating a depth dependency of the relative amplitude of a vertical displacement component for a third Rayleigh wave in a two-layer structure composed of a (0001) AlN thin film and a (001) [100] diamond crystal thin film when kH is set to 1.8, 3.0, 4.0 and 6.0.
Figure 15:
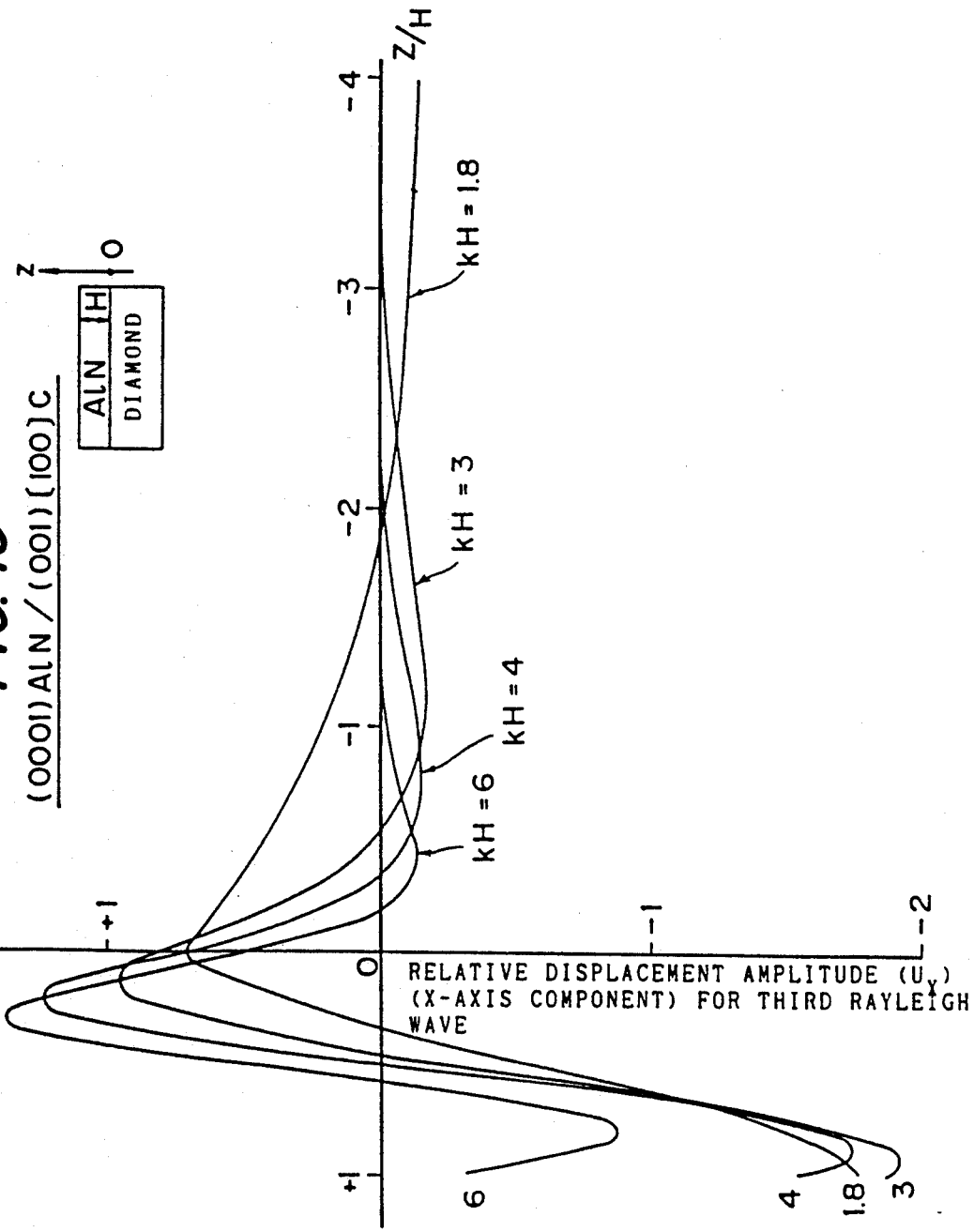
FIG. 15 is a diagram illustrating a depth dependency of the relative amplitude of longitudinal displacement component for a third Rayleigh wave in a two-layer structure composed of a (0001) AlN thin film and a (001) [100] diamond crystal thin film when kH is set to 1.8, 3.0, 4.0 and 6.0.

FIG. 14 is a diagram showing results of analysis regarding a depth (Z direction) dependency of the relative displacement amplitude (Z-axis component) $U_Z$ of a SAW when kH is changed to 1.8, 3.0, 4.0 and 6.0, and FIG. 15 is a diagram showing results of analysis regarding a depth dependency (Z direction) of the relative displacement amplitude (X-axis component) $U_X$ of a SAW when kH is changed to 1.8, 3.0, 4.0 and 6.0. In each of the figures, the axis of abscissa indicates a value Z/H obtained by dividing the distance in the Z-axis direction from an interface between a diamond crystal thin film and an AlN thin film by the thickness H of the AlN thin film to normalize the same. It is to be noted that $U_Z$ and $U_X$ are relative values where the absolute value of a maximum amplitude of Z-axis components is made equal to 1. On the other hand, FIG. 16 is a diagram showing results of analysis regarding depth (Z direction) dependency of the relative potential of a SAW when kH is changed to 1.8, 3.0 and 6.0.

Figure 16:
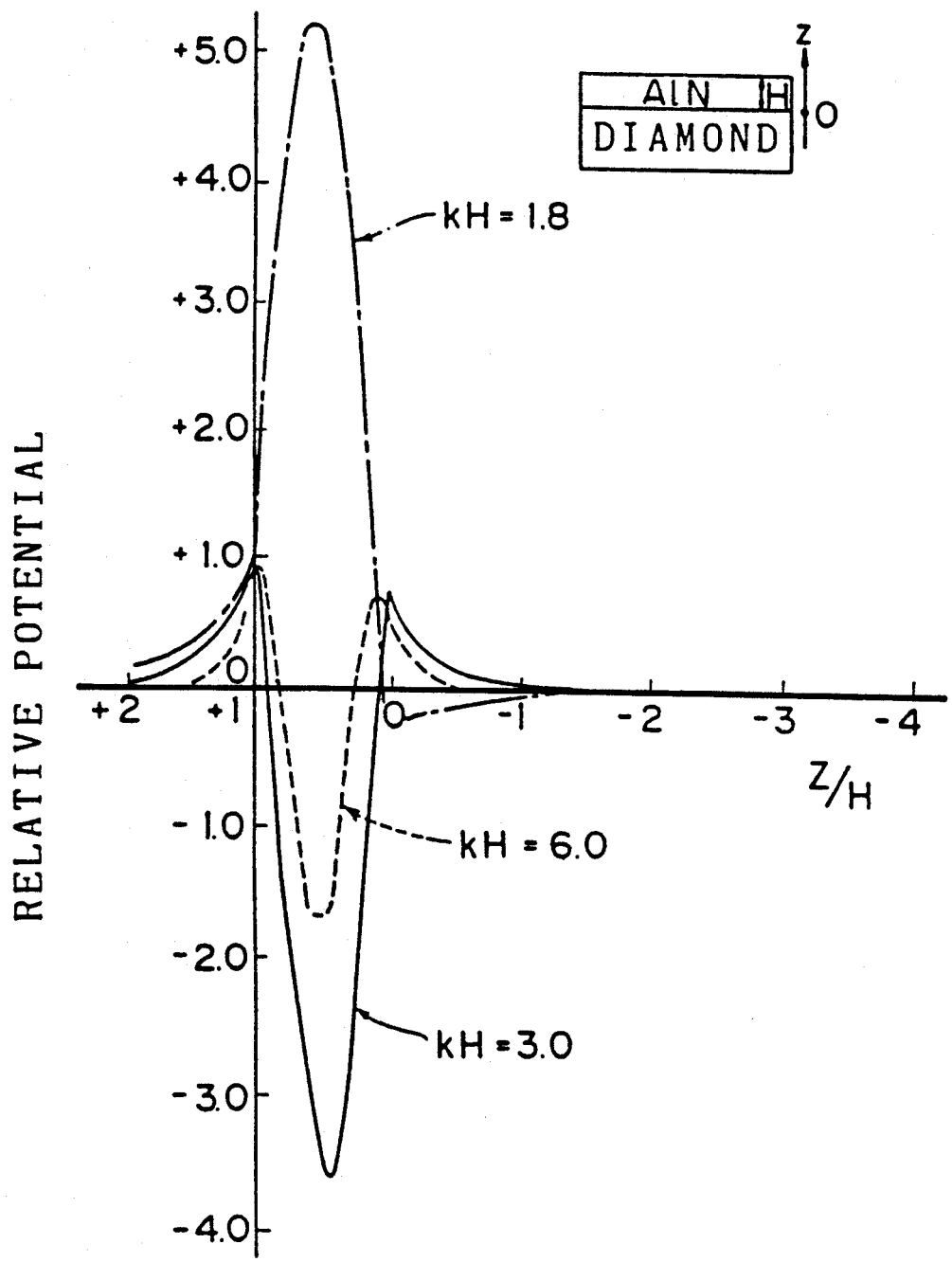
FIG. 16 is a diagram illustrating a depth dependency of the relative potential for a third Rayleigh wave in a two-layer structure composed of a (0001) AlN thin film and a (001) [100] diamond crystal thin film.

It can be seen from the results of analysis shown in FIGS. 14 to 16 that the relationship between the thickness D of a diamond crystal thin film and the thickness H of an AlN thin film necessary to enclose a third Rayleigh wave in the two-layer films of the diamond crystal thin film and the AlN thin film should be satisfactorily $D \geq 4H$.

From the above analysis results, it can be seen that a narrowband SAW filter for 7 GHz which meets the conditions of 10,000 m/sec $\leq V_P \leq$ 11,000 m/sec and $0.15\% \leq K^2_{eff} \leq 0.3\%$ can be realized by comprising a basic construction of a three-layer structure comprised of a single-crystal semiconductor substrate of a Si single-crystal, a GaAs single-crystal or the like, a diamond crystal thin film and an AlN thin film with IDT electrodes provided on the AlN thin film and the thickness D of the diamond crystal thin film and the thickness H of the AlN thin film are set to values which satisfy the conditions of $D \geq 4H$ and $3.5 \leq kH \leq 5.0$. Besides, as the IDT electrodes are provided on the AlN thin film and the thickness H of the AlN thin film is set to a value which satisfies the condition of $3.5 \leq kH \leq 5.0$, the coupling degree of a spurious first Rayleigh wave can be suppressed. Accordingly, a narrowband SAW filter for 7 GHz which is high in stability can be provided.

Where the SAW device is constructed for 7 GHz, the finger width d of the IDT electrodes can be set to a value of the range of 0.357 $\mu m \leq d \leq$ 0.393 $\mu m$. Accordingly, the electrode pattern can be formed readily by the photo-lithography technique employing a far-ultraviolet exposure equipment.

Subsequently, a description will be given as another embodiment of the first basic form of the present invention, of a SAW device which is high in stability and easy to produce for realizing a wideband voltage-controlled oscillator or a wide bandpass filter for a wide frequency range from the VHF to the UHF, using a Sezawa wave (denoted at s in FIG. 8). Characteristics required for a SAW device which is high in stability and easy to produce for realizing a wideband voltage-controlled oscillator or a wide bandpass filter are that the phase velocity $V_P$ is a value within the range of $$V_P \geq 8,000 \text{ m/sec}$$

and the effective electromechanical coupling coefficient $K^2_{eff}$ is a value within the range of $$K^2_{eff} \geq 0.5\%$$

In order to satisfy the former condition, the thickness H of an AlN thin film should satisfy the following condition $$1.1 \leq kH \leq 6.0$$

as can be seen from FIG. 8. If, for example, kH=2, then $V_P$=10,200 m/sec, and where the finger width d of IDT electrodes is 1.0 $\mu m$, the frequency f=2.5 GHz ($V_P$=f×4d). Thus, a nearly 2.5 GHz SAW device can be realized by the photo-lithography technique employing ultraviolet exposure. On the other hand, if the electrode finger width d is set to d=0.3 $\mu m$, then a SAW device for f=8.5 GHz can be realized by the photo-lithography technique employing far-ultraviolet exposure. Further, since the phase velocity $V_P$ is $V_P$=8.050 m/sec even when kH=6.0, a SAW device for f=6 to 7 GHz can be realized by the photo-lithography technique employing far-ultraviolet exposure. It can be understood from those facts that a Sezawa wave in a two-layer structure composed of a diamond crystal and an AlN thin film is a hopeful wave from the point of view of the high speed.

Subsequently, an investigation will be made of the possibility of realization of the aimed value ($K^2_{eff} \leq 0.5\%$) of the effective electromechanical coupling coefficient $K^2_{eff}$ regarding a Sezawa wave.

Figure 17:
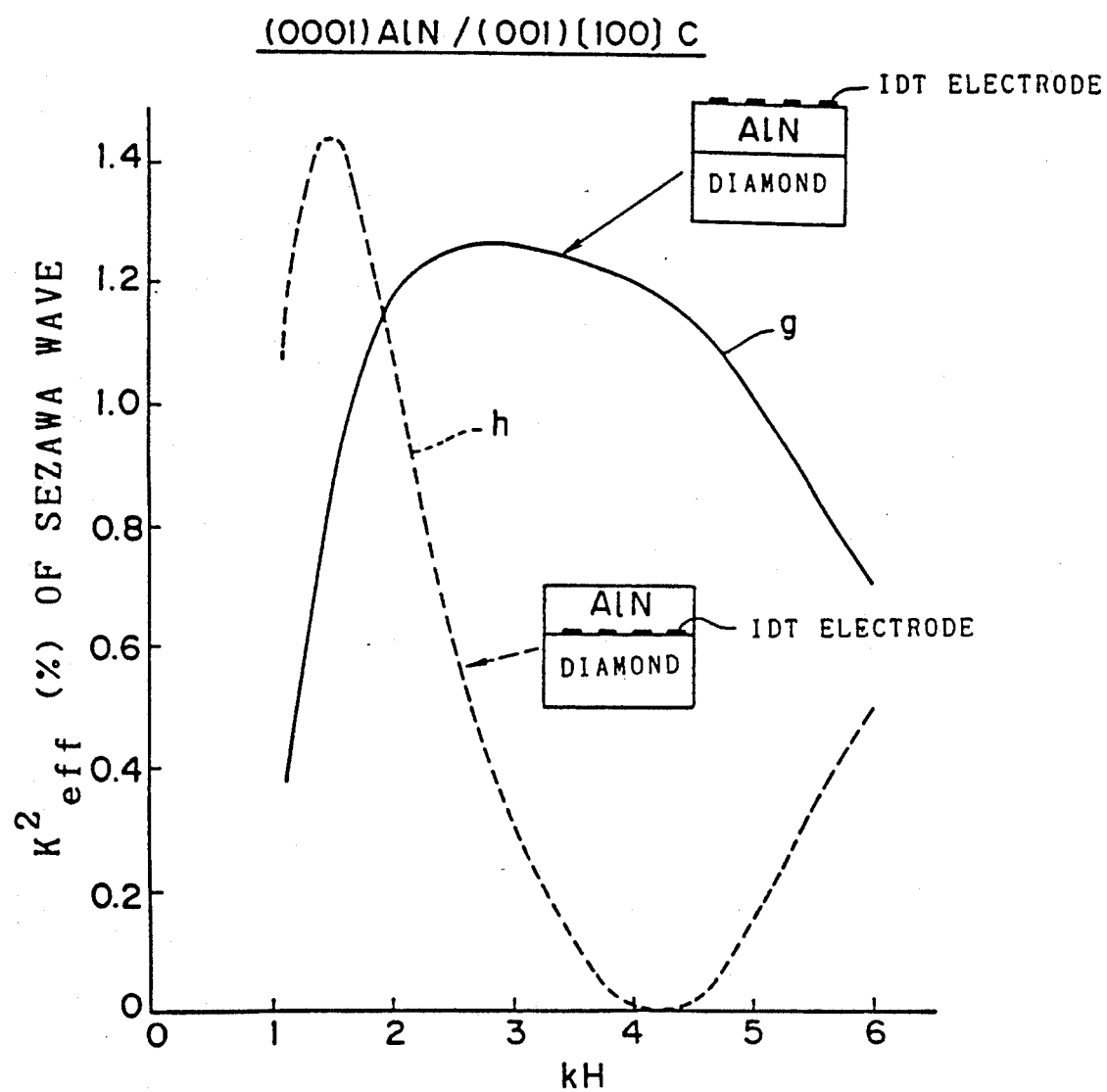
FIG. 17 and 18 are diagrams illustrating kH dependencies of the effective electromechanical coupling coefficients $K^2_{eff}$ for a Sezawa wave in a two-layer structure composed on a (0001) AlN thin film and a (001) [100] diamond crystal thin film.
Figure 18:
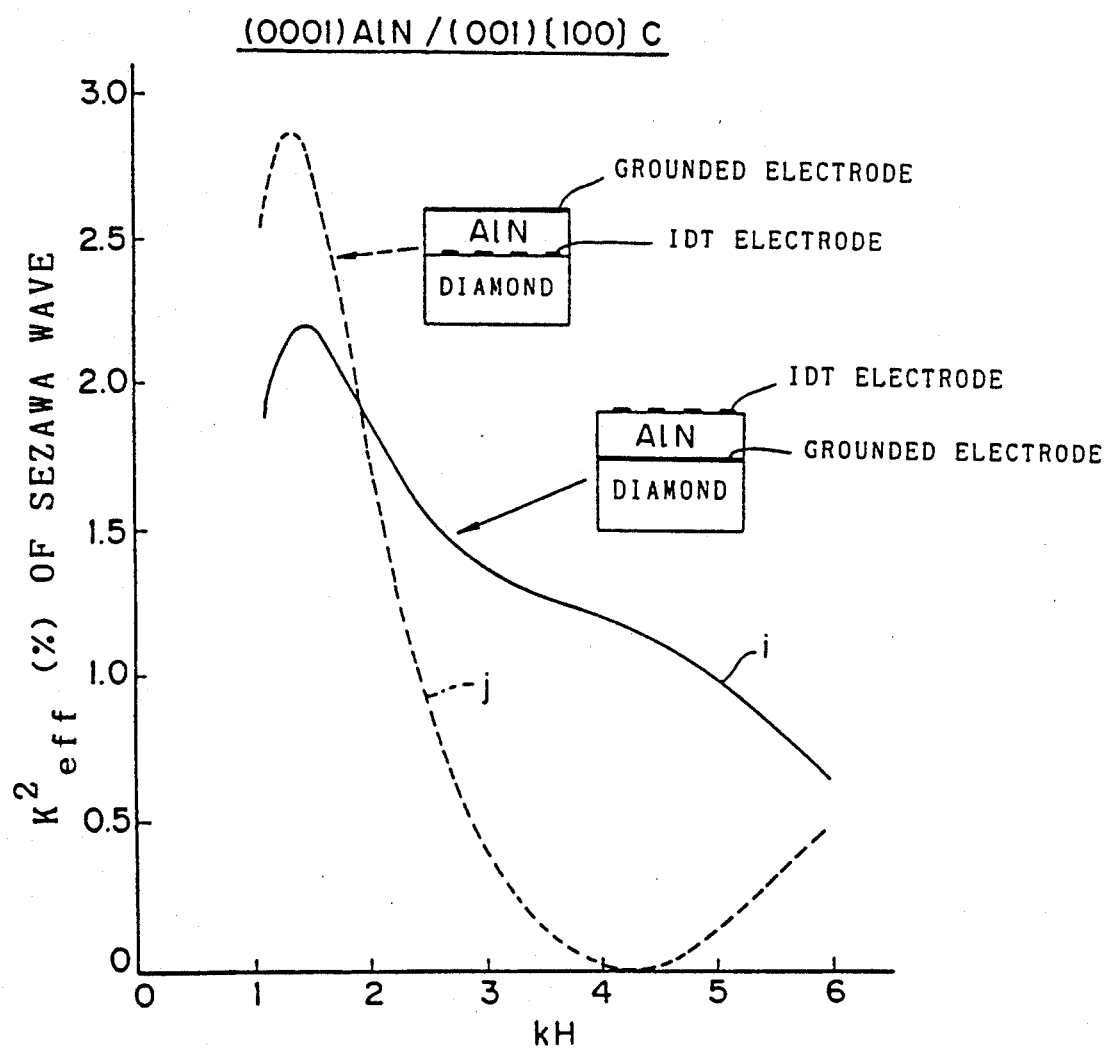

When the effective electromechanical coupling coefficient $K^2_{eff}$ is investigated, four electrode configurations are available. FIGS. 17 and 18 illustrates results of analysis of a kH dependency of the effective electromechanical coupling coefficient $K^2_{eff}$ when a Sezawa wave is used for the four electrode configurations.

Referring to FIG. 17, the curve g shows a kH dependency of the effective electromechanical coupling coefficient $K^2_{eff}$ where IDT electrodes are placed on an AlN thin film. The curve h shows a kH dependency of the electromechanical coupling coefficient $K^2_{eff}$ where IDT electrodes are placed on interface between a diamond crystal thin film and an AlN thin film.

On the other hand, referring to FIG. 18, the curve i shows a kH dependency of the effective electromechanical coupling coefficient $K^2_{eff}$ where IDT electrodes are placed on an AlN thin film and a grounded electrode is disposed on the interface between a diamond crystal thin AlN thin film. The curve j shows a kH dependency of the effective electromechanical coupling coefficient $K^2_{eff}$ where IDT electrodes are place on the interface between a diamond crystal thin film and an AlN thin film and a grounded electrode is placed on the AlN thin film.

From FIGS. 17 and 18, where IDT electrodes are provided on interface between a diamond crystal thin film and an AlN thin film (in the case of the curves h and j of the figures), a comparatively high effective electromechanical coupling coefficient $K^2_{eff}$ can be obtained within a limited range of the AlN thin film. However, if it is taken into consideration that the technique for making a frequency adjustment is limited only to adjustment of the thickness of the AlN thin film, the frequency adjustment is not easy because the variation of the effective electromechanical coupling coefficient $K^2_{eff}$ with respect to a variation $\Delta H$ of the film thickness is great and the permissible range of the film thickness H is limited. Accordingly, it is not preferable to provide IDT electrodes on interface between a diamond crystal thin film and an AlN thin film.

On the other hand, where IDT electrodes are provided on an AlN thin film (in the case of the curve g of FIG. 17), the condition of $0.5\% \leq K^2_{eff} \leq 1.26\%$ is obtained over a wide range of $1.1 \leq kH \leq 6.0$, and it can be understood that a comparatively high electromechanical coupling coefficient $K^2_{eff}$ is obtained. Besides, within the range of $2 \leq kH \leq 4$, the variation of the effective electromechanical coupling coefficient $K^2_{eff}$ is low, and the characteristics of the SAW device can be stabilized. Meanwhile, where IDT electrodes are provided on an AlN thin film and a ground electrode is provided on interface between a diamond single-crystal thin film and the AlN thin film (in the case of the curve i of FIG. 18), the condition of $0.7\% \leq K^2_{eff} \leq 2.2\%$ is obtained over a wide range of $1.1 \leq kH \leq 6.0$, and a higher electromechanical coupling coefficient $K^2_{eff}$ can be obtained.

Where IDT electrodes made of a metal such as aluminum are provided on an AlN thin film in this manner, the frequency adjustment is easy. In particular, by forming IDT electrodes with a somewhat greater thickness from aluminum or the like and then shaving the IDT electrodes by chemical or physical etching, the frequency can be adjusted in an increasing direction, and a SAW device of a desired frequency characteristic can be realized. In this instance, since the AlN thin film which constitutes the upper layer is a chemically and physically stable material, there is no possibility that it may be damaged upon etching processing.

Accordingly, in order to readily realize the aimed value ($V_P \geq 8,000$ m/sec) of the phase velocity $V_P$ of a Sezawa wave and the aimed value ($K^2_{eff} \geq 0.5\%$) of the effective electromechanical coupling coefficient $K^2_{eff}$ in a two-layer structure composed of a diamond crystal and an AlN thin film or a three-layer structure composed of a Si single-crystal or a GaAs single-crystal, a diamond crystal thin film and an AlN thin film and to facilitate the frequency adjustment, the AlN thin film orientated to the C-axis should be formed on the diamond single-crystal (thin film) by a magnetron sputtering method or the like such that the thickness H of the AlN thin film may satisfy the condition of $1.1 \leq kH \leq 6.0$ and IDT electrodes should be formed on the AlN thin film.

Subsequently, an investigation will be made of the thickness D of a diamond crystal thin film necessary to substantially enclose a Sezawa wave in two-layer films of the diamond crystal thin film and an AlN thin film where the diamond crystal thin film is formed on a single-crystal semiconductor substrate. Generally, in order to enclose a Sezawa wave or a Rayleigh wave of a higher degree within a diamond crystal thin film and an AlN thin film, a sufficient thickness D is required for a diamond crystal thin film. However, where a fundamental Sezawa wave mode is used as in the present invention, the thickness D of the diamond crystal thin film can be reduced.

Figure 19:
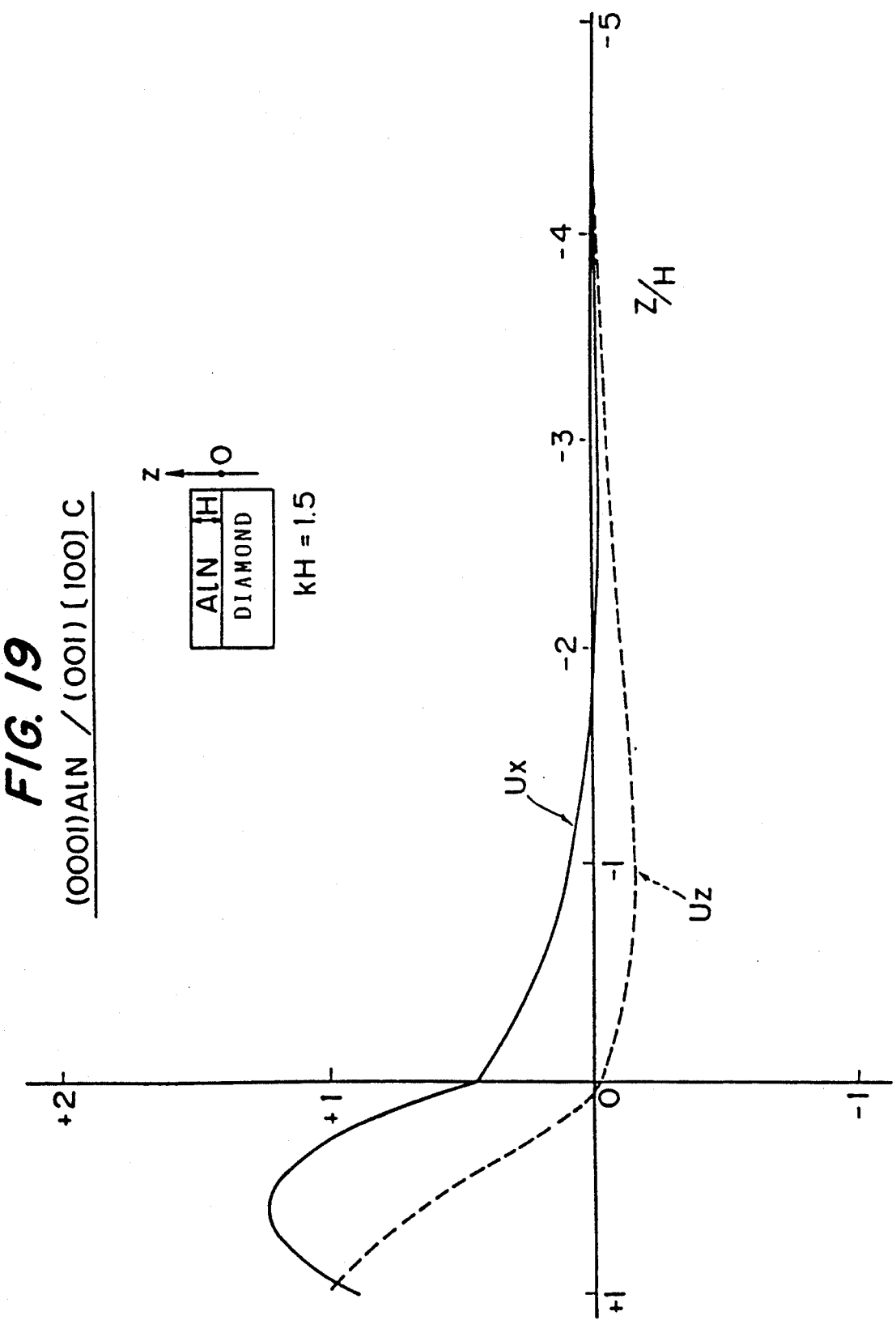
FIGS. 19 to 21 are diagrams illustrating depth dependencies of the relative displacement amplitudes for a Sezawa wave in a two-layer structure composed of a (0001) AlN thin film and a (001) [100] diamond single-crystal thin film when kH is set to 1.5, 2.0, and 3.0.
Figure 20:
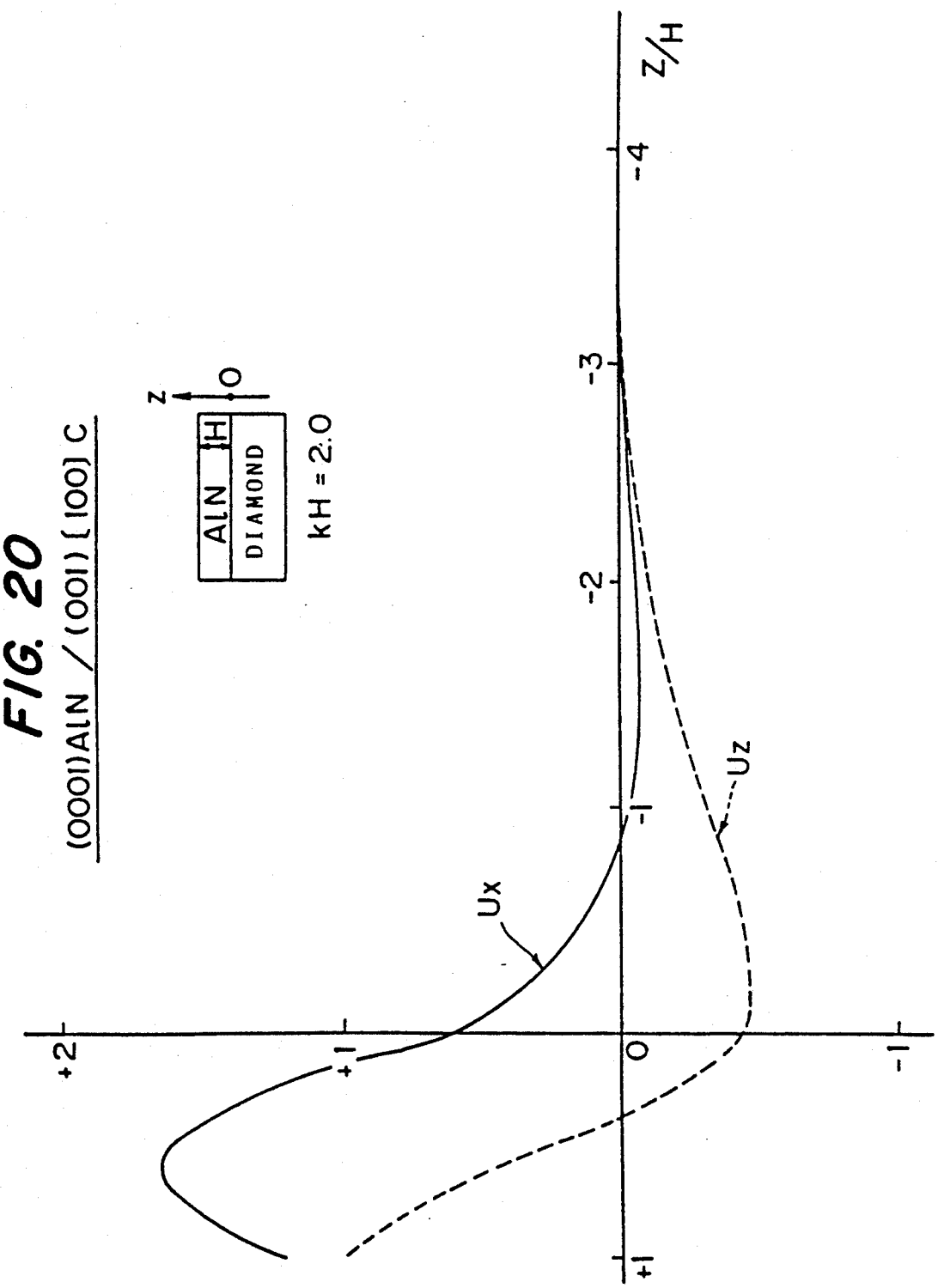
Figure 21:
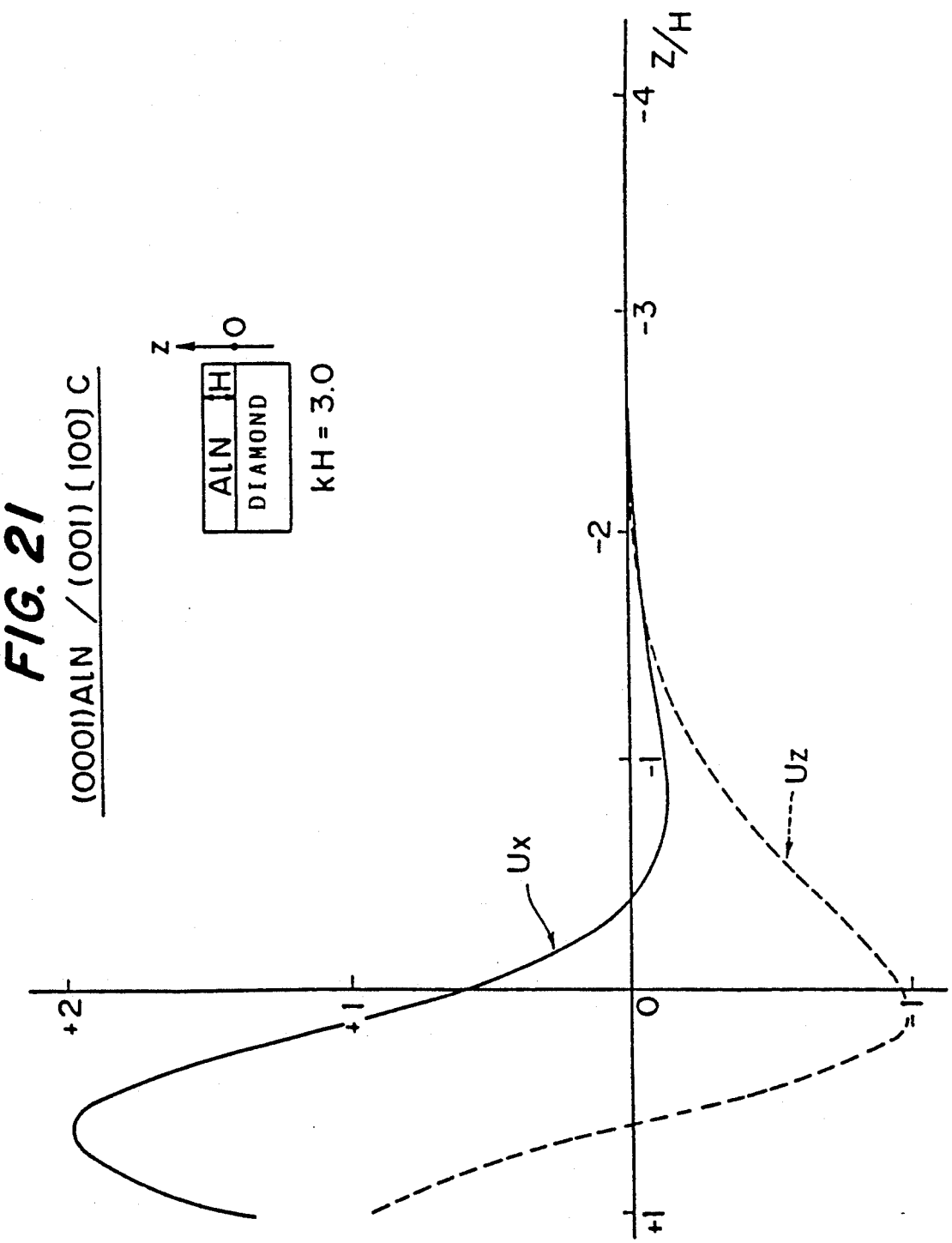

FIGS. 19 and 21 are diagrams illustrating results of analysis of a depth (Z direction) dependency of the relative amplitude of displacement for a Sezawa wave when kH is changed to 1.5, 2.0 and 3.0. In those figures, the axis of abscissa represents a distance in the Z-axis direction from an interface between a diamond crystal thin film and an AlN thin film with a value Z/H obtained by dividing the distance by a thickness H of the AlN thin film to normalize the same. The solid line characteristic curve $U_Z$ indicates a relative amplitude value of a Z-axis component, while the broken line characteristic curve $U_X$ indicates a relative amplitude value of an X-axis component. It is to be noted that $U_Z$ and $U_X$ represent relative values when the absolute value of a maximum amplitude of the Z-axis component is represented by 1. From the figures, it can be apparently seen that as kH increases, that is, as the thickness H of an AlN thin film, if it is assumed that the wave length determined by the electrode finger width d is fixed, increases, the attenuance of a Sezawa increases and the energy concentrates on a location proximate a surface of the AlN thin film. Accordingly, the relationship between the thickness D of the diamond crystal thin film and the thickness H of the AlN thin film necessary to enclose a Sezawa wave within the two-layer films of the diamond crystal thin film and the AlN thin film should satisfactorily be $D \geq 5H$.

From the results of analysis described above, by constituting a substrate construction as a three-layer structure comprised of a single-crystal semiconductor substrate of a Si single-crystal, a GaAs single-crystal or the like, a diamond crystal thin film and an AlN thin film and providing IDT electrodes on the AlN thin film such that the thickness D of the diamond crystal thin film and the thickness H of the AlN thin film may satisfy the conditions of $D \geq 5H$ and $1.1 \leq kH \leq 6.0$, a SAW device can be realized which satisfies the conditions of $V_P \geq 8,000$ m/sec and $K^2_{eff} \geq 0.5\%$. In this instance, since the IDT electrodes are provided in an exposed relationship on the AlN thin film, the frequency adjustment can be made readily by adjusting the thickness of the IDT electrodes after formation of the IDT electrodes.

Figure 22:
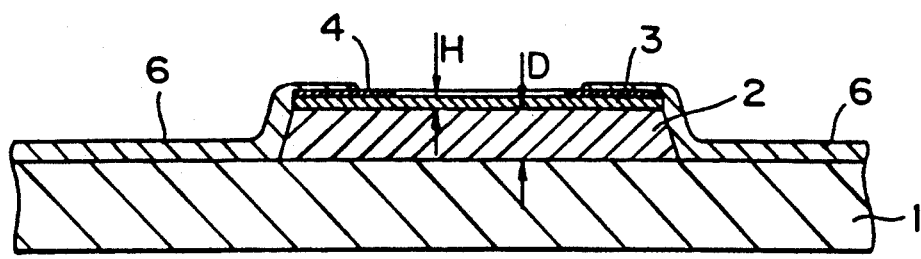
FIG. 22 is a vertical section of a SAW device showing a desirable embodiment for the first basic form of the present invention.
Figure 23:
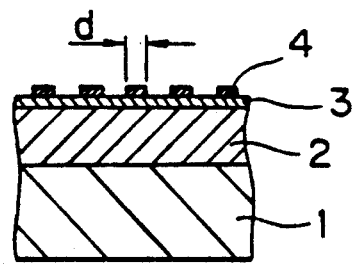
FIG. 23 is cross section of the SAW device shown in FIG. 22.
Figure 24:
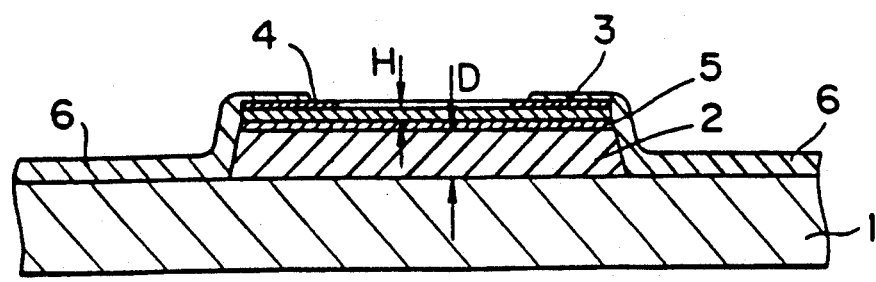
FIG. 24 is a vertical section of a SAW device showing another desirable embodiment for the first basic form of the present invention.

FIGS. 22 and 23 are views schematically showing a sectional construction of a SAW device wherein IDT electrodes are provided on an AlN thin film as a preferred embodiment of the first basic form of the present invention. FIG. 24 is a view schematically showing a sectional construction of a SAW device wherein IDT electrodes are provided on an AlN thin film and a grounded electrode is provided on an interface between a diamond crystal thin film and the AlN thin film. In those figures, reference 1 denotes a single-crystal semiconductor substrate formed from a Si single-crystal, a GaAs single-crystal or the like, 2 a diamond crystal thin film, 3 an AlN thin film orientated to the C-axis, and 4 an IDT electrode. In the SAW device shown in FIG. 24, a ground electrode 5 is formed on an interface between the diamond crystal thin film 2 and the AlN thin film 3. In those embodiments, the thickness D of the diamond crystal thin film 2 and the thickness H of the AlN thin film 3 are set, when a narrowband timing tank filter or bandpass filter for use in a microwave region is to be provided, such that they may satisfy the conditions of $3.5 \leq kH \leq 5.0$ and $D \geq 4H$, respectively. But when a wideband voltage-controlled oscillator or a wide bandpass filter is to be provide. These parameters may satisfy the conditions of $1.1 \leq kH \leq 6.0$ and $D \geq 5H$.

As can be seen from FIGS. 22 to 24, since each of the SAW devices has the single-crystal semiconductor substrate 1 formed from a Si single-crystal, a GaAs single-crystal or the like, it is possible to use the single-crystal semiconductor substrate 1 as a common substrate and form a peripheral LSI or LSIs (not shown) and the SAW device in an integrated relationship on the common substrate. Besides, an electric connection to the LSI or LSIs can be made readily by means of a conductive thin film or films 6 of Al, Au or the like. Accordingly, the mass production is facilitated and the reliability is improved comparing with the prior art wherein a SAW device is formed in a separate relationship from an LSI or LSIs and connected to the latter by means of a bonding wire or the like.

Figure 25A:
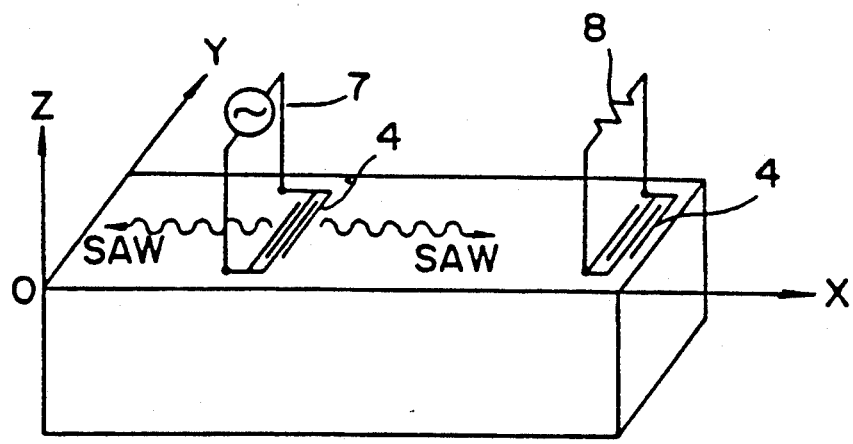
FIG. 25A is a schematic illustration showing an applicational example of the SAW device shown in FIGS. 22 and 23.
Figure 25B:
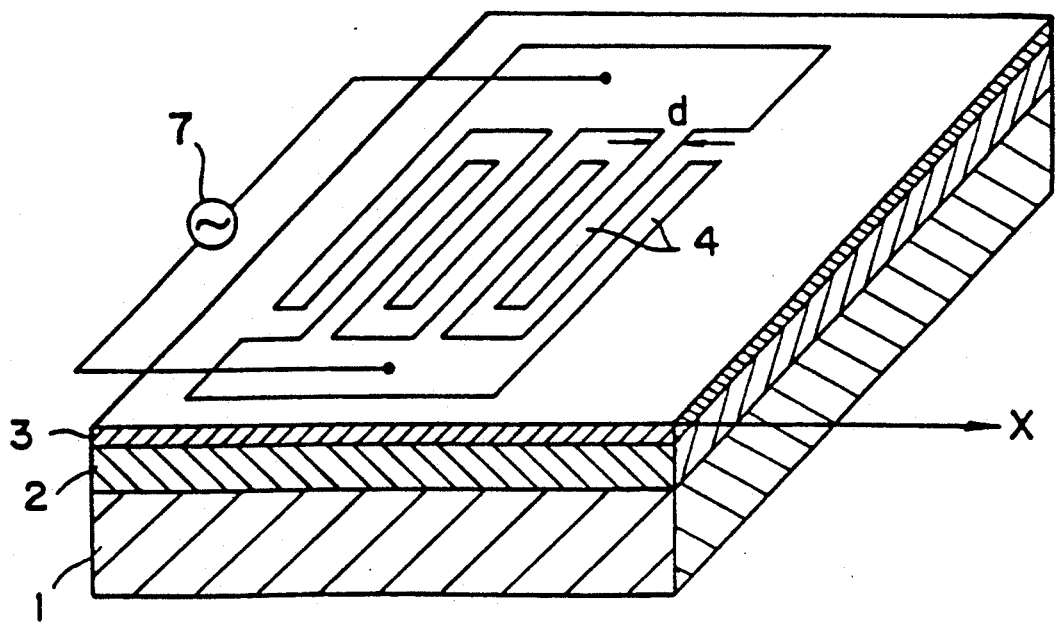
FIG. 25B is a schematic perspective section of the SAW device near an IDT electrode shown in FIG. 25A.

FIG. 25A is a schematic view showing an example of application of the SAW device shown in FIGS. 22 and 23. FIG. 25B is a schematic sectional perspective view taken along a location near an IDT electrode of the SAW device shown in FIG. 25A. Two sets of IDT electrodes 4 are formed at opposing locations, and SAWs are generated in response to a signal from an input side high frequency circuit 7 by the electrodes 4 of one set, while the thus propagated SAWs are converted by the other IDT electrodes 4 again into an electric signal which is applied to an output side load circuit 8. It is to be noted that such structure is suitable for a filter circuit such as a timing tank filter or a bandpass filter or for a delay line circuit. Meanwhile, in order to realize a resonator, though not shown, means for reflecting SAWs should be provided on the opposite sides of a single IDT electrode with respect to the SAW propagating direction. In this instance, a reflecting grating is more suitable as the reflecting means than a single reflecting plane in prevention of a loss in mode conversion.

It is to be noted that, as apparent from the analyses described above, in the first basic form of the present invention, a SAW device may be provided not necessarily by crystal growth of a diamond crystal thin film on a substrate such as a single-crystal semiconductor substrate but also in a two-layer structure composed of a natural or industrially produced diamond crystal and an AlN thin film.

According to the first basic form of the present invention described above, where, for example, a third Rayleigh wave is used, a SAW filter for 7 to 10 GHz can be realized when the photo-lithography employing far-ultraviolet radiation as a light source is used, and a SAW filter for 10 to 20 GHz can be realized when an electron beam is used. However, the first basic form has a drawback in production that, when an AlN thin film is evaporated on a synthetic diamond polycrystal thin film or a synthetic diamond single-crystal by a PVD method or a CVD method, it is difficult to assure crystal growth of the C-axis orientation AlN thin film having a good characteristic.

Thus, the second basic form of the present invention makes use of the rule of thumb of Bravais that the C-axis is oriented, with respect to an amorphous substrate, in a direction perpendicular to the substrate. For example, a zinc oxide (ZnO) film or an AlN piezoelectric thin film can be C-axis oriented readily on a pyrex glass or fused quartz.

Thus, formation of an AlN thin film is facilitated by depositing a $SiO_2$ thin film in the form of an amorphous film on a diamond crystal by a PVD method, CVD method or the like and C-axis orienting the AlN thin film on the $SiO_2$ thin film.

Figure 26:
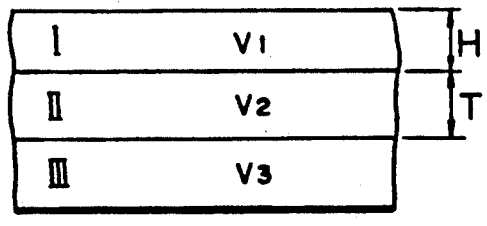
FIGS. 26 and 27 are schematic views illustrating relationships between velocities of thickness shear wave for each layer in three-layer structures.
Figure 27:
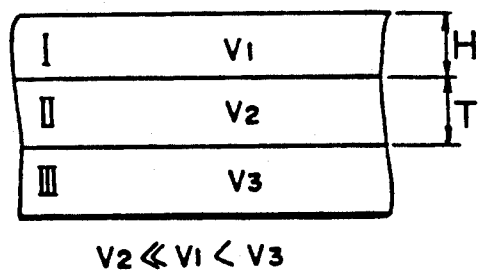

However, the acoustic velocity of a bulk wave which propagates in a $SiO_2$ thin film is very low at about one half the acoustic velocity of a bulk wave which propagates in an AlN thin film. Generally, in the case of a SAW device having a three-layer structure, when the propagating velocities $v_1$, $v_2$ and $v_3$ of a film thickness shear wave in the first layer I, second layer II and third layer III, respectively, from above in FIG. 26 have the relationship of $v_1 < v_2 < v_3$. SAWs of a fundamental wave mode and higher degree wave modes of a Rayleigh wave are allowed to propagate in the SAW device. However, when the propagating velocities $v_1$, $v_2$ and $v_3$ of a film thickness shear wave in the first layer I, second layer II and third layer III, respectively, have the relationship of $v_2 << v_1 < v_3$ as shown in FIG. 27, only a fundamental Rayleigh wave mode is allowed to propagate only in the first layer I and the second layer II.

Thus, if the thickness T of the $SiO_2$ thin film which is the second layer can be controlled within a predetermined range with respect to the thickness H of the AlN thin film which is the first layer, then it can be considered that a third Rayleigh wave mode which has an ultra high velocity greater than or equal to the acoustic velocity of 10,000 m/sec is allowed to propagate. Standing on such a point of view, an investigation will be made of a suitable thickness of a $SiO_2$ thin film which can be produced actually and in which a third Rayleigh wave mode can be enclosed and propagate in three layers.

Figure 28:
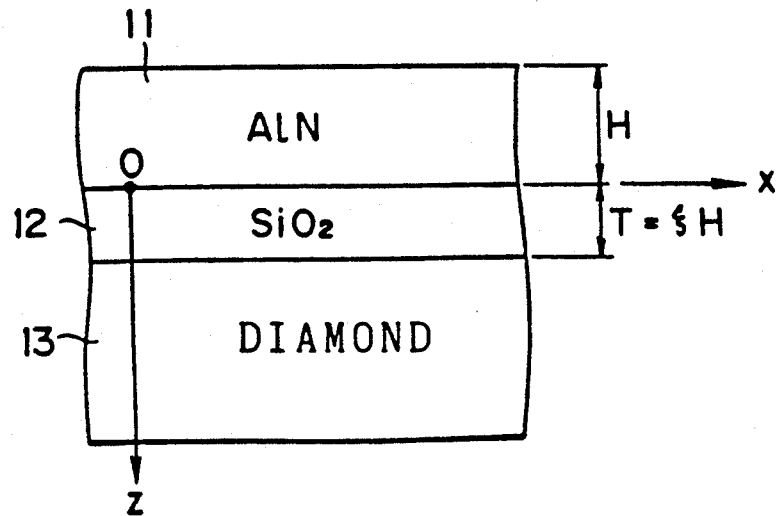
FIG. 28 is a schematic view showing a basic construction of a SAW device according to a second basic form of the present invention.

FIG. 28 is a view schematically showing a SAW device of the second basic form of the present invention. The SAW device includes, from above, an AlN thin film 11 (with a thickness H), a $SiO_2$ thin film 12 (with a thickness $T = \xi H$) and a diamond crystal thin film 13 formed from a synthetic diamond polycrystal or a synthetic diamond single-crystal. The axes of coordinates include an X-axis parallel to the thin films, a Z-axis perpendicular to the thin films, and a Y-axis perpendicular to the plane of FIG. 28. Here, the cut plane of the diamond crystal 13 is a (001) while the AlN thin film 11 is a film with the C-axis oriented in the Z-axis direction, that is, a plane (0001) so that a SAW may propagate in the X-axis direction.

Figure 29:
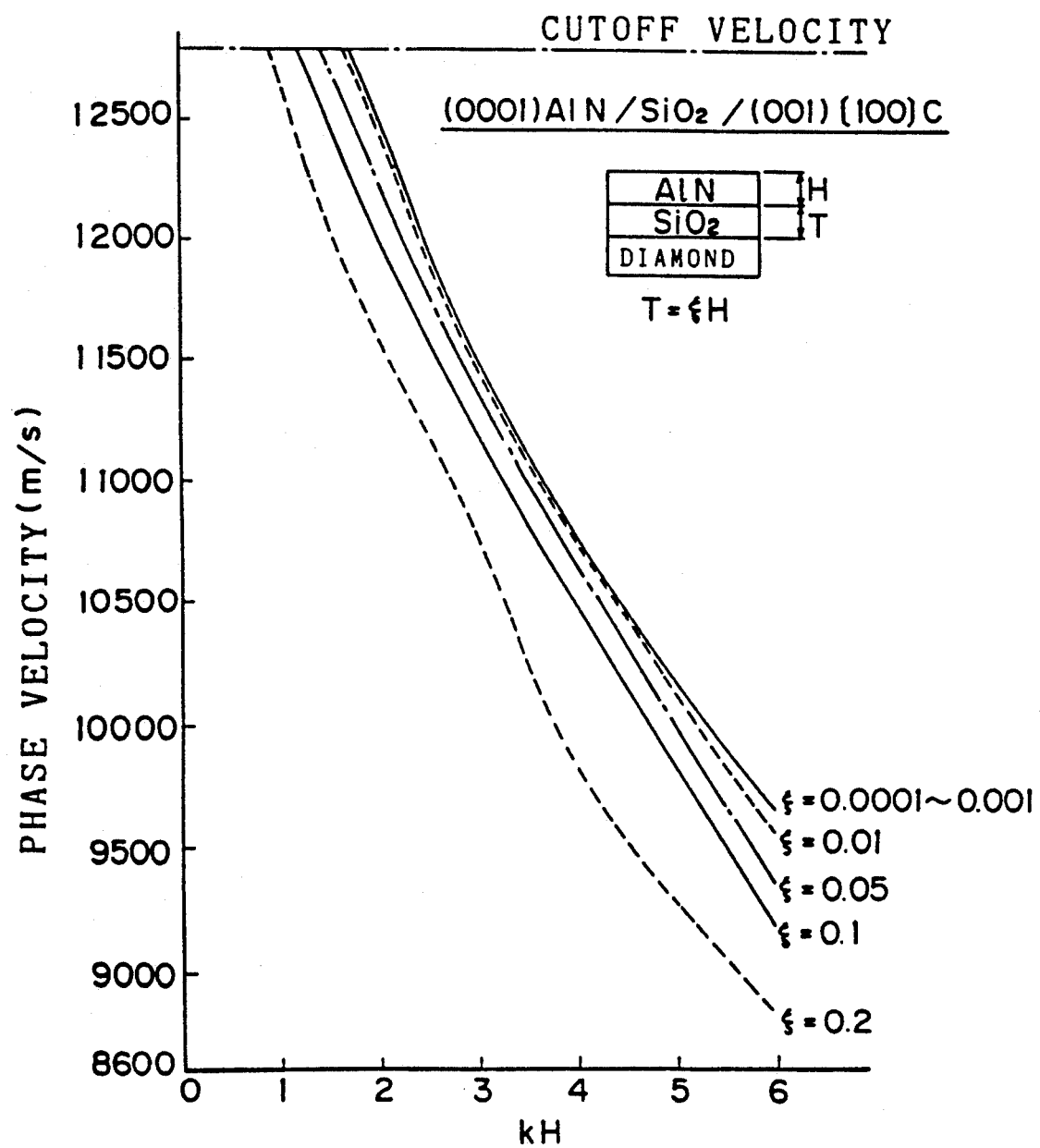
FIG. 29 is a diagram illustrating velocity dispersion characteristics for a third Rayleigh wave.
Figure 30:
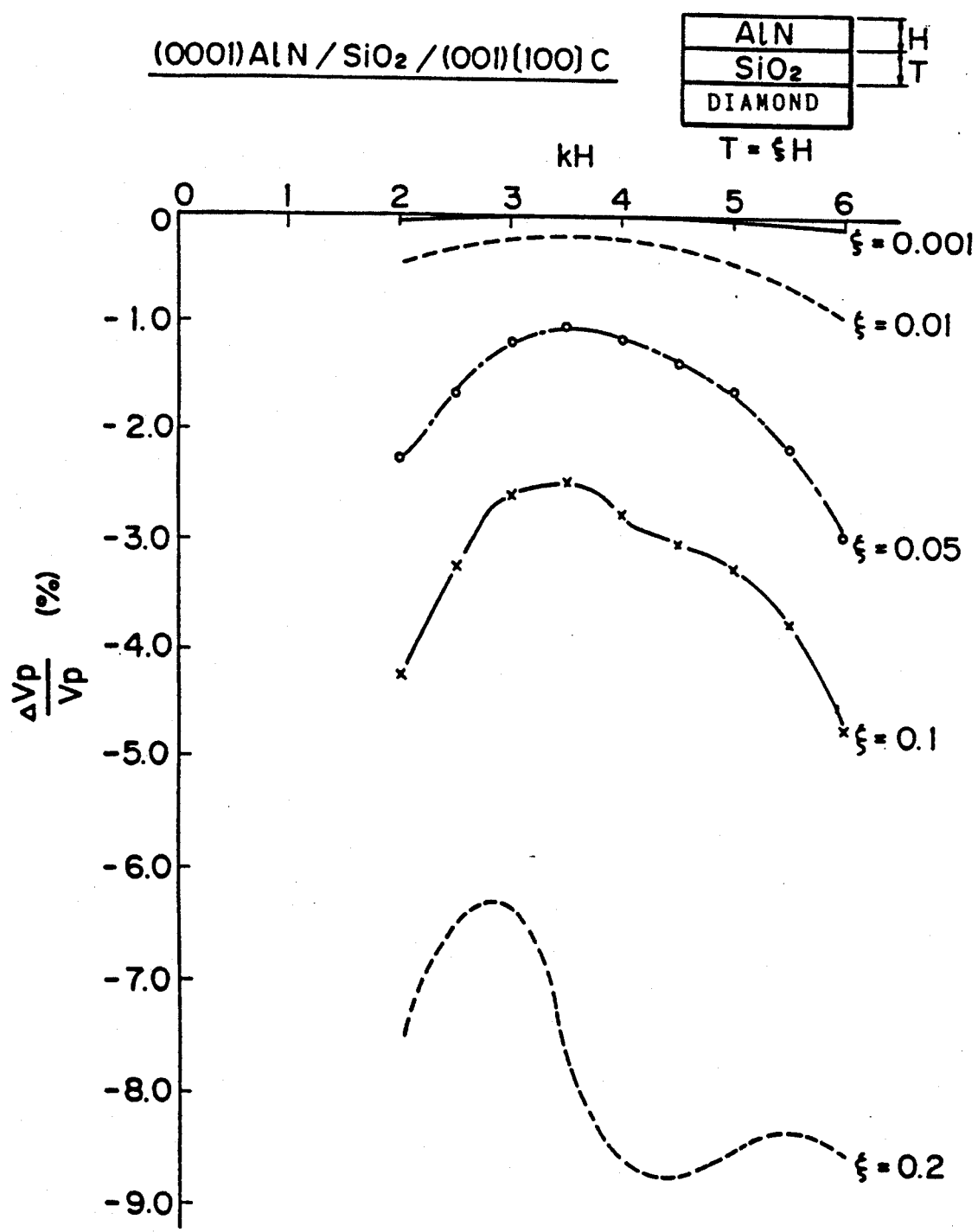
FIG. 30 is a diagram illustrating a rate of the phase velocity variation for a third Rayleigh wave versus a thickness parameter $\xi$ of a $SiO_2$ thin film.

FIG. 29 is a view showing the SAW velocity dispersion characteristics for a third Rayleigh wave mode in the structure shown in FIG. 28, that is, a dependency of the phase velocity $V_P$(m/sec) on the product kH of the thickness H of the AlN thin film and the wave number k of the SAW. Meanwhile, FIG. 30 is a view showing a rate of change $\Delta V_P/V_P$ of the phase velocity $V_P$ with respect to a parameter $\xi$ of the $SiO_2$ film. Here, the phase velocity (acoustic velocity) at $\xi = 0$ is adopted as a standard. The following facts become clear from FIGS. 29 and 30.

(1) At $\xi = 0.0001$ to $0.001$, the phase velocity of a third Rayleigh wave is almost invariable.

(2) There is a local maximum point of the rate of change $\Delta V_P/V_P$ of the phase velocity $V_P$ at a position of $kH = 3.5$, and as $\xi$ increases, the local maximum point is shifted in the direction in which kH decreases, that is, in the direction in which the wave length λ becomes λ>>H.

(3) In the case of kH=3.5, the rate of change $\Delta V_P/V_P$ (rate of decrease) of the phase velocity $V_P$ is −0.2% at ξ=0.01, −1.0% at ξ=0.05, −2.5% at ξ=0.1, and −7.7% at ξ=0.2.

From those facts, it can be understood that the condition of ξ>0.1 is not preferable for utilization because the phase velocity is significantly low and the region within which the phase velocity is higher than or equal to 10,000 m/sec comes within a limited range of kH≦3.7. The finger width d of IDT electrodes which can be realized by photo-lithography bases on far-ultraviolet exposure at present is d≧0.3 μm and the finger width d of IDT electrodes and the SAW phase velocity have a relationship of $d=(\frac{1}{4})\cdot V_P/\nu$ (ν is a frequency). Accordingly, while the phase velocity of a SAW relates to whether a SAW device for the 1 to 10 GHz can be realized using photo-lithography based on far-ultraviolet exposure, when a device of the second basic form of the present invention is to be applied as the SAW device, it is necessary to further examine on influence of a SiO$_2$ thin film upon the effective electromechanical coupling coefficient $K^2_{eff}$ which indicates a degree of the piezoelectricity.

Figure 31:
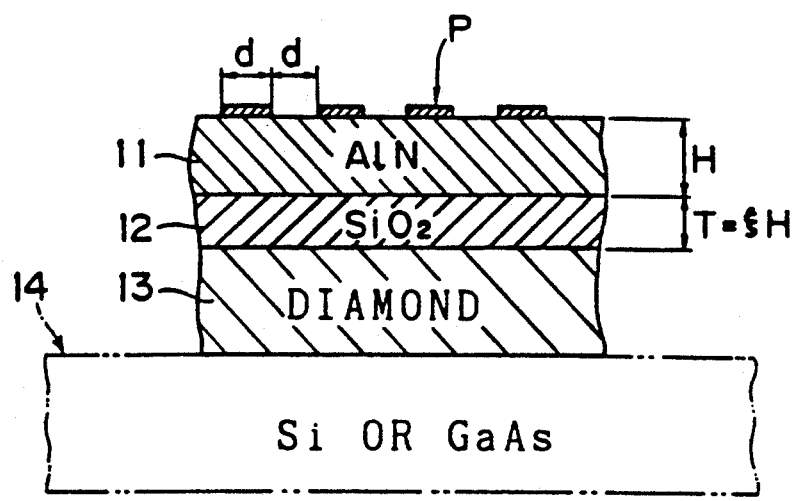
FIG. 31 is a partial section of a SAW device showing a desirable embodiment for the second basic form of the present invention.
Figure 32:
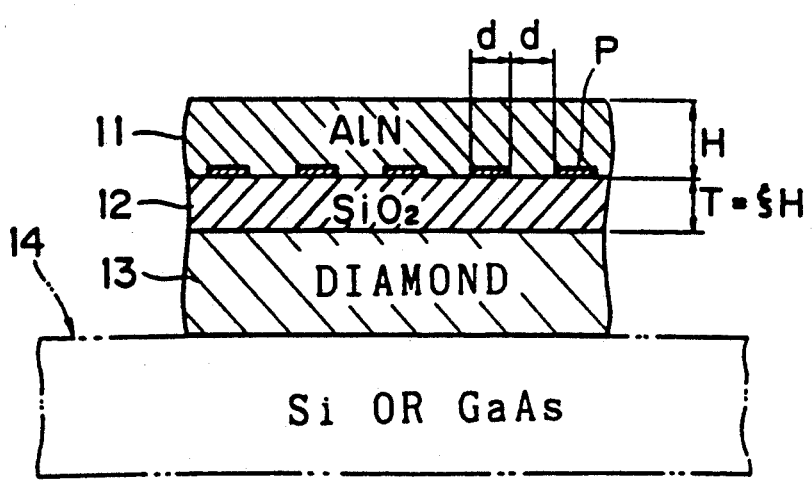
FIG. 32 is a partial section of a SAW device showing another desirable embodiment for the second basic form of the present invention.

IDT electrodes can be located in two various manners with respect to the three-layer structure of FIG. 28. FIG. 31 shows a desirable embodiment of the second basic form of the present invention wherein IDT electrodes P of aluminum (Al) are formed on an AlN thin film 11 by deposition. FIG. 32 shows another desirable embodiment of the second basic form of the present invention wherein IDT electrodes P of Al are provided on an interface between an AlN thin film 11 and a SiO$_2$ thin film 12.

FIG. 33 is a diagram showing a kH dependency of the effective electromechanical coupling coefficient $K^2_{eff}$ in the case of the configuration of FIG. 31, and FIG. 34 is a diagram showing a kH dependency of the electromechanical coupling coefficient $K^2_{eff}$ in the case of the configuration of FIG. 32. From FIG 33, it can be seen that, at ξ≦0.001, $K^2_{eff}$ presents little difference from that in the case of ξ=0.01 but at least within the range of 3.2≦kH≦4.7, $k^2_{eff}$ increases as ξ increases, and after ξ=0.05 is exceeded, $K^2_{eff}$ decreases suddenly. Accordingly, since $K^2_{eff}$ increases if the thickness of the SiO$_2$ thin film 12 is controlled within a limited range, it can be understood that it is advantageous to interpose the SiO$_2$ thin film 12 as an intermediate layer between the AlN thin film 11 and a diamond crystal thin film 13. However, since $K^2_{eff}$ decreases suddenly within the range of ξ>0.1, control within the range of ξ>0.1 is not preferable.

On the other hand, it can be seen also from FIG. 34 that $K^2_{eff}$ increases as ξ increases within the range of 3.7≦kH≦4.7. Accordingly, it can be understood that it is advantageous to interpose the SiO$_2$ thin film 12 between the AlN thin film 11 and a diamond crystal thin film 13. However, since $K^2_{eff}$ decreases within the range of ξ>0.1, control within the range of ξ>0.1 is not preferable.

As a result of the foregoing investigations of the two points of the dispersion characteristics of the SAW phase velocity and the effective electromechanical coupling coefficient, it has become apparent that a SAW device having the characteristics of $V_P ≧ 10,000$ m/sec and $K^2_{eff}≧0.1\%$ can be realized if the following conditions are satisfied.

(1) The film thickness T of the SiO$_2$ is controlled within 1/100 to 1/10 of the thickness H of the AlN thin film (0.01≦ξ≦0.1).

(2) Where IDT electrodes are provided on the AlN thin film, the thickness H of the AlN thin film is controlled so as to meet the condition of 3.2≦kH≦4.7.

(3) Where IDT electrodes are provided between the AlN thin film and the SiO$_2$ thin film, the thickness H of the AlN thin film is controlled so as to meet the condition of 3.7≦kH≦4.7.

For example, a SAW device for 10 GHz having the construction of FIG. 31 can be realized readily by two sets of values listed in Table 1 below.

TABLE 1

|  |  |  |
|---|---|---|
| kH | 0.1 | 0.05 |
|  | 3.5 | 3.5 |
| $K^2_{eff}$(%) | 0.21 | 0.18 |
| $V_P$(m/sec) | 10,800 | 11,000 |
| λ (μm) | 1.08 | 1.10 |
| d (μm) | 0.27 | 0.275 |
| H (Å) | 6,000 | 6,130 |
| T (Å) | 600 | 300 |

On the other hand, a SAW device for 5 GHz having the construction of FIG. 31 can be realized readily by two sets of values listed in Table 2 below.

TABLE 2

|  |  |  |
|---|---|---|
| kH | 0.1 | 0.05 |
|  | 3.5 | 3.5 |
| $K^2_{eff}$(%) | 0.21 | 0.18 |
| $V_P$(m/sec) | 10,800 | 11,000 |
| λ (μm) | 2.16 | 2.20 |
| d (μm) | 0.54 | 0.55 |
| H (Å) | 12,000 | 12,200 |
| T (Å) | 1,200 | 610 |

It is to be noted that, in constructing a SAW device according to the second basic form of the present invention, it is preferable to form, as shown in FIGS. 31 and 32, a three-layer structure composed of a diamond crystal thin film 13, a SiO$_2$ thin film 12 and an AlN thin film 11 on a semiconductor substrate 14 of Si, GaAs or the like similarly as in the embodiments of the first basic form of the present invention.

INDUSTRIAL APPLICABILITY

As described so far, as SAW device of the present invention is suitable to realize a narrowband timing tank filter or bandpass filter for use in a microwave region of several GHz to 20 GHz or a wideband voltage-controlled oscillator or a wide bandpass filter which is used in a wide frequency range from the VHF-band to the UHF-band.

I claim:

1. A surface acoustic wave device for propagating surface acoustic waves, comprising:
   a diamond crystal; and
   an aluminum nitride thin film formed on said diamond crystal.

2. A surface acoustic wave device as set forth in claim 1, further comprising:
   interdigital transducer electrodes formed on said aluminum nitride thin film.

3. A surface acoustic wave device as set forth in claim 2, wherein said aluminum nitride thin film has a thickness H selected to satisfy $$3.5 \leq kH \leq 5.0$$

where k is a wave number, and so that a third Rayleigh surface acoustic wave propagates in said diamond crystal and said aluminum nitride thin film.

4. A surface acoustic wave device as set forth in claim 2, wherein said aluminum nitride thin film has a thickness H selected to satisfy $$1.1 \leq kH \leq 6.0$$

where k is a wave number, and so that a Sezawa surface acoustic wave propagates in said diamond crystal and said aluminum nitride thin film.

5. A surface acoustic wave device as set forth in claim 1, wherein said diamond crystal includes:
a single-crystal semiconductor substrate; and
a diamond crystal thin film formed on said substrate.

6. A surface acoustic wave device as set forth in claim 5, further comprising:
interdigital transducer electrodes formed on said aluminum nitride thin film.

7. A surface acoustic wave device as set forth in claim 6, wherein said aluminum nitride thin film has a thickness H selected to satisfy $$3.5 \leq kH \leq 5.0$$

where k is a wave number, and wherein
said diamond crystal thin film and the thickness H of said aluminum nitride thin film have the relationship of $$D \geq 4H$$

and so that a third Rayleigh surface acoustic wave propagates in said diamond crystal thin film and said aluminum nitride thin film.

8. A surface acoustic wave device as set forth in claim 6, wherein said aluminum nitride thin film has a thickness H selected to satisfy $$1.1 \leq kH \leq 6.0$$

where k is a wave number, and wherein
said diamond crystal thin film and the thickness H of said aluminum nitride thin film have the relationship of $$D \geq 5H$$

and so that a Sezawa surface acoustic wave propagates in said diamond crystal thin film and said aluminum nitride thin film.

9. A surface acoustic wave device, comprising:
a diamond crystal;
a silicon dioxide thin film formed on said diamond crystal; and
an aluminum nitride thin film formed on said silicon dioxide thin film.

10. A surface acoustic wave device as set forth in claim 9, wherein said aluminum nitride thin film has a thickness H, and wherein
said silicon dioxide thin film has a thickness T selected to satisfy $$0.01H \leq T \leq 0.1H$$

where H is the thickness H of said aluminum nitride thin film.

11. A surface acoustic wave device as set forth in claim 10, further comprising:
interdigital transducer electrodes formed on said aluminum nitride thin film which has the thickness H selected to satisfy $$3.2 \leq kH \leq 4.7$$

where k is a wave number, and so that a third Rayleigh surface acoustic wave propagates in said three-layer structure.

12. A surface acoustic wave device as set forth in claim 10, further comprising:
interdigital transducer electrodes formed on the interface between said aluminum nitride thin film and said silicon dioxide thin film, and wherein
said aluminum nitride thin film has thickness H which satisfies $$3.7 \leq kH \leq 4.7$$

where k is a wave number, and so that a third Rayleigh surface acoustic wave propagates in said three-layer structure.

13. A surface acoustic wave device as set forth in claim 9, wherein said diamond crystal includes:
a single-crystal semiconductor substrate; and
diamond crystal thin film formed on said single-crystal semiconductor substrate.

14. A surface acoustic wave device for propagating surface acoustic waves, comprising:
a diamond crystal;
an ground electrode formed on said diamond crystal; and
an aluminum nitride thin film formed on said ground electrode.

15. A surface acoustic wave device as set forth in claim 14, further comprising:
interdigital transducer electrodes formed on said aluminum nitride thin film.

16. A surface acoustic wave device as set forth in claim 15, wherein said aluminum nitride thin film has a thickness H selected to satisfy $$3.5 \leq kH \leq 5.0$$

where k is a wave number, and so that a third Rayleigh surface acoustic wave propagates in said acoustic wave device.

17. A surface acoustic wave device as set forth in claim 15, wherein said aluminum nitride thin film has a thickness H selected to satisfy $$1.1 \leq kH \leq 6.0$$

where k is a wave number, and so that a Sezawa surface acoustic wave propagates in said acoustic wave device.

18. A surface acoustic wave device as set forth in claim 14, wherein said diamond crystal includes:
a single-crystal semiconductor substrate; and
a diamond crystal thin film formed on said substrate.

19. A surface acoustic wave device as set forth in claim 18, further comprising:
interdigital transducer electrodes formed on said aluminum nitride thin film.

20. A surface acoustic wave device as set forth in claim 19, wherein said aluminum nitride thin film has a thickness H selected to satisfy $$3.5 \leq kH \leq 5.0$$

where k is a wave number, and wherein
said diamond crystal thin film and the thickness H of said aluminum nitride thin film have the relationship of $$D \geq 4H$$

and so that a third Rayleigh surface acoustic wave propagates in said diamond crystal thin film and said aluminum nitride thin film.

21. A surface acoustic wave device as set forth in claim 19, wherein said aluminum nitride thin film has a thickness H selected to satisfy $$1.1 \leq kH \leq 6.0$$

where k is a wave number, and wherein
said diamond crystal thin film and the thickness H of said aluminum nitride thin film have the relationship of $$D \geq 5H$$

and so that a Sezawa surface acoustic wave propagates in said diamond crystal thin film and said aluminum nitride thin film.

22. A surface acoustic wave device as set forth in claim 13, wherein said aluminum nitride thin film has a thickness H, and wherein
said silicon dioxide thin film has a thickness T selected to satisfy $$0.01H \leq T \leq 0.1H$$

where H is the thickness H of said aluminum nitride thin film.

23. A surface acoustic wave device as set forth in claim 22, further comprising:
interdigital transducer electrodes formed on said aluminum nitride thin film which has the thickness H selected to satisfy $$3.2 \leq kH \leq 4.7$$

where k is a wave number, and so that a third Rayleigh surface acoustic wave propagates in said three-layer structure.

24. A surface acoustic wave device as set forth in claim 22, further comprising:
interdigital transducer electrodes formed on the interface between said aluminum nitride thin film and said silicon dioxide thin film, and wherein
said aluminum nitride thin film has thickness H which satisfies $$3.7 \leq kH \leq 4.7$$

where k is a wave number, and so that a third Rayleigh surface acoustic wave propagates in said three-layer structure.

* * * * *

UNITED STATES PATENT AND TRADEMARK OFFICE
CERTIFICATE OF CORRECTION

PATENT NO. : 5,235,233
DATED : August 10, 1993
INVENTOR(S) : Shin-ichi Yamamoto

It is certified that error appears in the above-indentified patent and that said Letters Patent is hereby corrected as shown below:

Col. 3, line 58, change both occurrences of "$\geq$" to --$\leq$--.

Col. 4, lines 16, 27 and 38, change all occurrences of "$\geq$" to --$\leq$--.

Col. 6, line 57, change both occurrences of "$\geq$" to --$\leq$--.

Col. 8, lines 20 and 33, both occurrences, change "composed" to --comprised--; and line 50, change "sc" to --sec--.

Col. 9, line 53, change "preferably" to --preferable--.

Col. 12, line 1, after "given" insert --,--.

line 45, change -- $\leq$ to $\geq$ --.

line 65, after the first occurrence of "thin" insert --film and the--.

Col. 14, line 8, change "and" to --to--.

Col. 17, line 46, change "$k^2$" to --$K^2$--.

Col. 18, top of first column in both tables, insert --$\xi$--.

line 42, change "composed" to --comprised--.

lines 47-55, delete title "INDUSTRIAL APPLICABILITY" and entire paragraph prior to "I claim:".

UNITED STATES PATENT AND TRADEMARK OFFICE
CERTIFICATE OF CORRECTION

PATENT NO. : 5,235,233

DATED : August 10, 1993

INVENTOR(S) : Shin-ichi Yamamoto

It is certified that error appears in the above-indentified patent and that said Letters Patent is hereby corrected as shown below:

Col. 18, lines 47-55, delete title "INDUSTRIAL APPLICABILITY" and entire paragraph prior to "I claim:".

Signed and Sealed this

Thirtieth Day of August, 1994

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,235,233
DATED : August 10, 1993
INVENTOR(S) : Shin-ichi Yamamoto

It is certified that error appears in the above-indentified patent and that said Letters Patent is hereby corrected as shown below:

Title Page, [73] Assignee, "Fanuc Ltd., Japan" should be --Fujitsu Limited, Kawasaki, Japan--.

Signed and Sealed this

Eleventh Day of October, 1994

Attest:

BRUCE LEHMAN

Attesting Officer         Commissioner of Patents and Trademarks